United States Patent
Uchida et al.

(10) Patent No.: US 8,575,729 B2
(45) Date of Patent: Nov. 5, 2013

(54) SEMICONDUCTOR CHIP WITH LINEAR EXPANSION COEFFICIENTS IN DIRECTION PARALLEL TO SIDES OF HEXAGONAL SEMICONDUCTOR SUBSTRATE AND MANUFACTURING METHOD

(75) Inventors: Masao Uchida, Osaka (JP); Masashi Hayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/579,432

(22) PCT Filed: May 13, 2011

(86) PCT No.: PCT/JP2011/002685
§ 371 (c)(1),
(2), (4) Date: Aug. 16, 2012

(87) PCT Pub. No.: WO2011/145310
PCT Pub. Date: Nov. 24, 2011

(65) Prior Publication Data
US 2012/0319249 A1     Dec. 20, 2012

(30) Foreign Application Priority Data

May 18, 2010 (JP) .................... 2010-114405
May 18, 2010 (JP) .................... 2010-114406

(51) Int. Cl.
*H01L 21/78* (2006.01)
*H01L 29/04* (2006.01)
(52) U.S. Cl.
USPC ........................................ 257/628; 438/460
(58) Field of Classification Search
CPC ......... H01L 21/02; H01L 29/04; H01L 21/20;
H01L 21/28; H01L 21/78; H01L 27/04;
H01L 29/06; H01L 29/12; H01L 29/417;
H01L 29/47; H01L 29/78; H01L 29/861;
H01L 29/872
USPC ............ 257/628, E29.003, E21.599; 438/460
See application file for complete search history.

(56) References Cited

U.S. PATENT DOCUMENTS

| 6,072,197 | A | 6/2000 | Horino et al. |
| 2002/0063258 | A1 | 5/2002 | Motoki |

(Continued)

FOREIGN PATENT DOCUMENTS

| JP | 02-275614 A | 11/1990 |
| JP | 07-188927 A | 7/1995 |

(Continued)

OTHER PUBLICATIONS

International Search Report for corresponding International Application No. PCT/JP2011/002685 mailed Aug. 23, 2011.

(Continued)

*Primary Examiner* — Walter H Swanson
(74) *Attorney, Agent, or Firm* — Renner, Otto, Boisselle & Sklar, LLP

(57) ABSTRACT

The semiconductor chip (18) of the present invention is a semiconductor chip (18) on which a power semiconductor device (10) is formed, and which includes a semiconductor substrate made from a hexagonal semiconductor, in which the semiconductor substrate has a shape of a rectangle on a principal surface, in which the rectangle is defined by two sides having lengths a and b equal to each other, and in which linear expansion coefficients in directions parallel to the two sides of the semiconductor substrate are equal to each other.

17 Claims, 17 Drawing Sheets

(56) References Cited

U.S. PATENT DOCUMENTS

| | | | |
|---|---|---|---|
| 2009/0026485 A1* | 1/2009 | Urano et al. | 257/99 |
| 2009/0057847 A1 | 3/2009 | Nakayama | |
| 2009/0101936 A1 | 4/2009 | Kamei et al. | |
| 2009/0114910 A1 | 5/2009 | Chang | |
| 2009/0127564 A1 | 5/2009 | Irikura et al. | |
| 2009/0283760 A1 | 11/2009 | Fujii | |
| 2010/0219419 A1 | 9/2010 | Hata et al. | |
| 2010/0244063 A1 | 9/2010 | Yokogawa et al. | |
| 2012/0138951 A1 | 6/2012 | Hayashi et al. | |

FOREIGN PATENT DOCUMENTS

| | | | |
|---|---|---|---|
| JP | 10-135576 | * | 5/1998 |
| JP | 10-135576 A | | 5/1998 |
| JP | 11-340576 A | | 12/1999 |
| JP | 2002-124473 | * | 4/2002 |
| JP | 2002-124473 A | | 4/2002 |
| JP | 2002-170992 A | | 6/2002 |
| JP | 2004-014709 A | | 1/2004 |
| JP | 2004-128521 A | | 4/2004 |
| JP | 2005-332892 A | | 12/2005 |
| JP | 2007-059552 A | | 3/2007 |
| JP | 2007-073700 | | 3/2007 |
| JP | 2007-081096 A | | 3/2007 |
| JP | 2007-103585 A | | 4/2007 |
| JP | 2008-066717 A | | 3/2008 |
| JP | 2008-227205 A | | 9/2008 |
| JP | 2008-282942 A | | 11/2008 |
| JP | 2009-126727 A | | 6/2009 |
| WO | 2007/010645 A1 | | 1/2007 |
| WO | 2010/029720 A1 | | 3/2010 |

OTHER PUBLICATIONS

International Preliminary Report on Patentability (PCT/IPEA/416/409) for corresponding International Application No. PCT/JP2011/002685 dated Apr. 10, 2012 (with partial English translation).

Li et al., "Thermal Expansion and Thermal Expansion Anisotropy of SiC Polytypes", Journal of the American Ceramic Society, vol. 70, No. 7, pp. 445-448, Jul. 1987.

H. Morkoc, "Handbook of Nitride Semiconductors and Devices", vol. I, p. 17.

Notice of Reasons for Rejection issued on Jul. 6, 2012 and a partial English translation for Japanese Patent Application No. 2012-515742, which is a national phase application of PCT/JP2011/002685.

Co-pending U.S. Appl. No. 13/389,708, filed Feb. 9, 2012.

International Search Report for related International Application No. PCT/JP2011/002684 mailed Aug. 16, 2011.

Notice of Allowance for related U.S. Appl. No. 13/389,708 filed on Feb. 9, 2012.

* cited by examiner

*FIG.7*
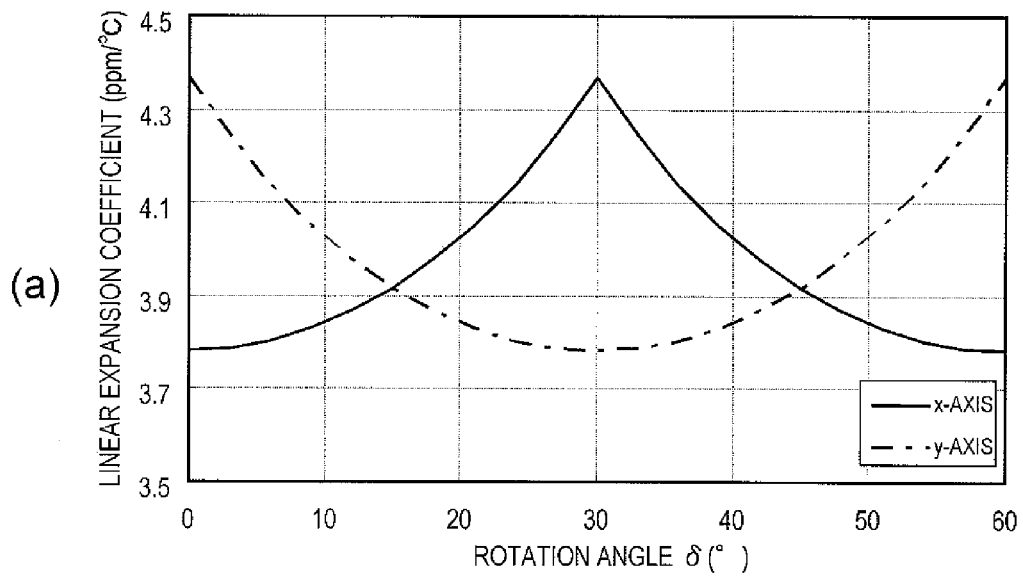
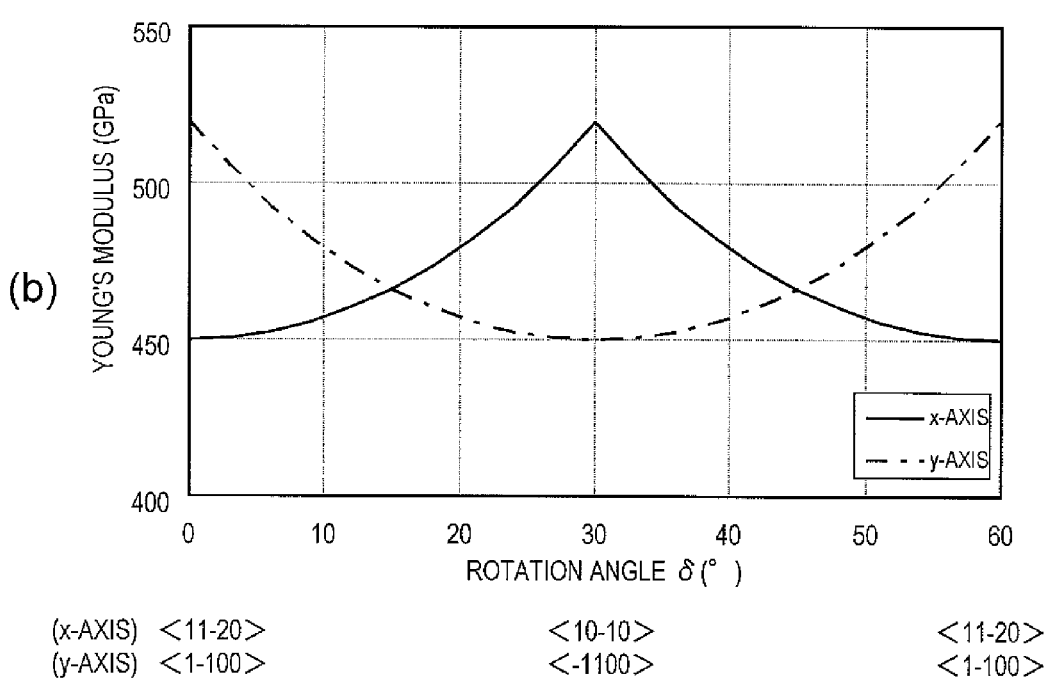

*FIG.8*
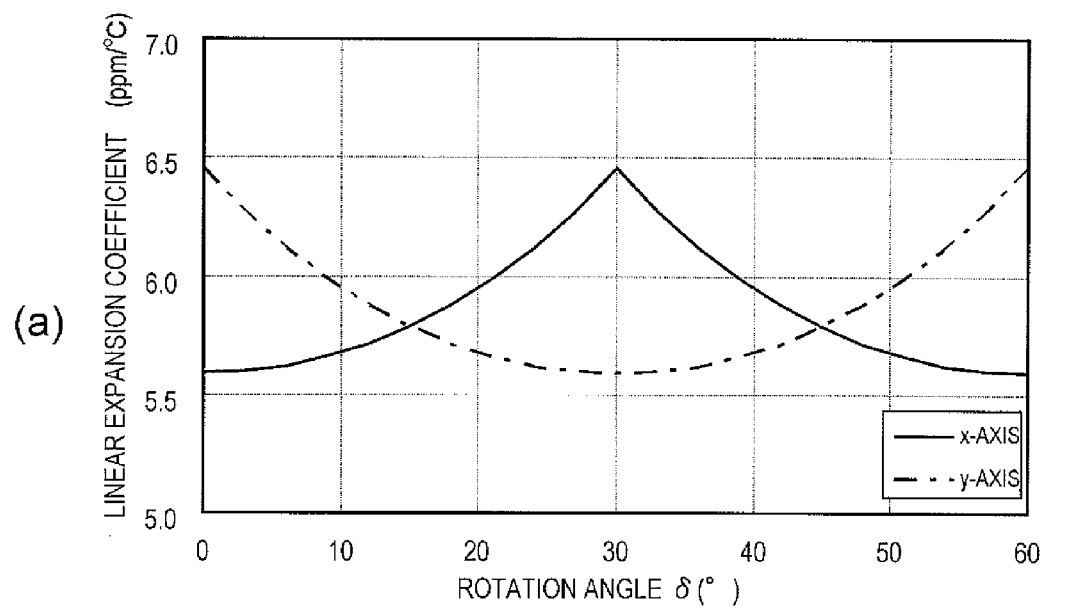
(a)
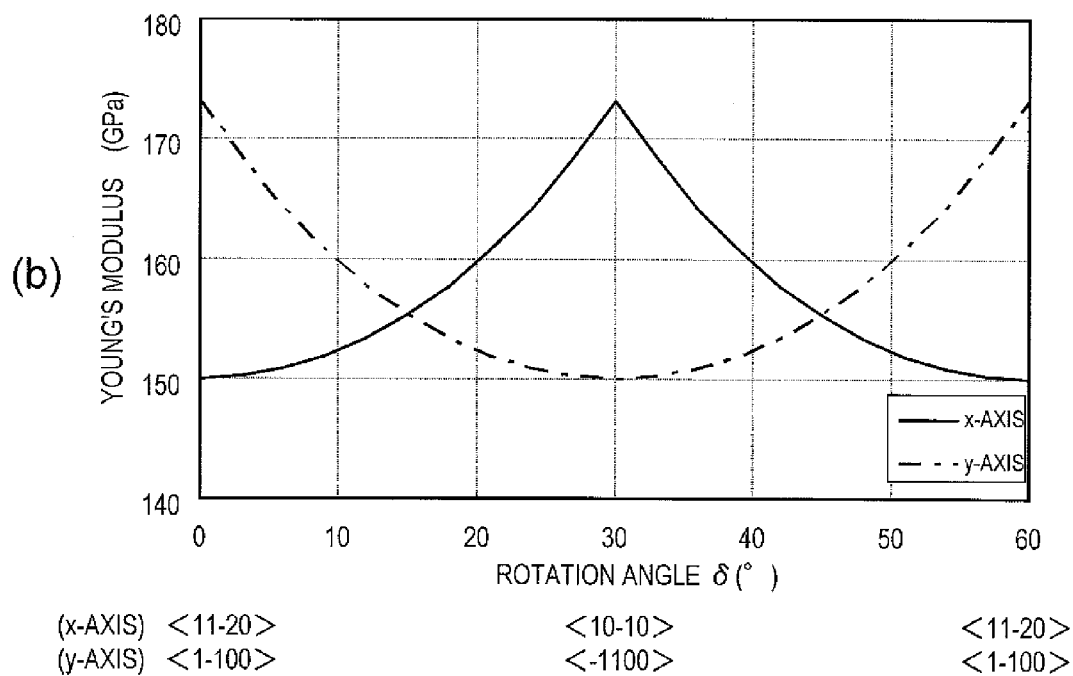
(b)

*FIG.11*
(a)
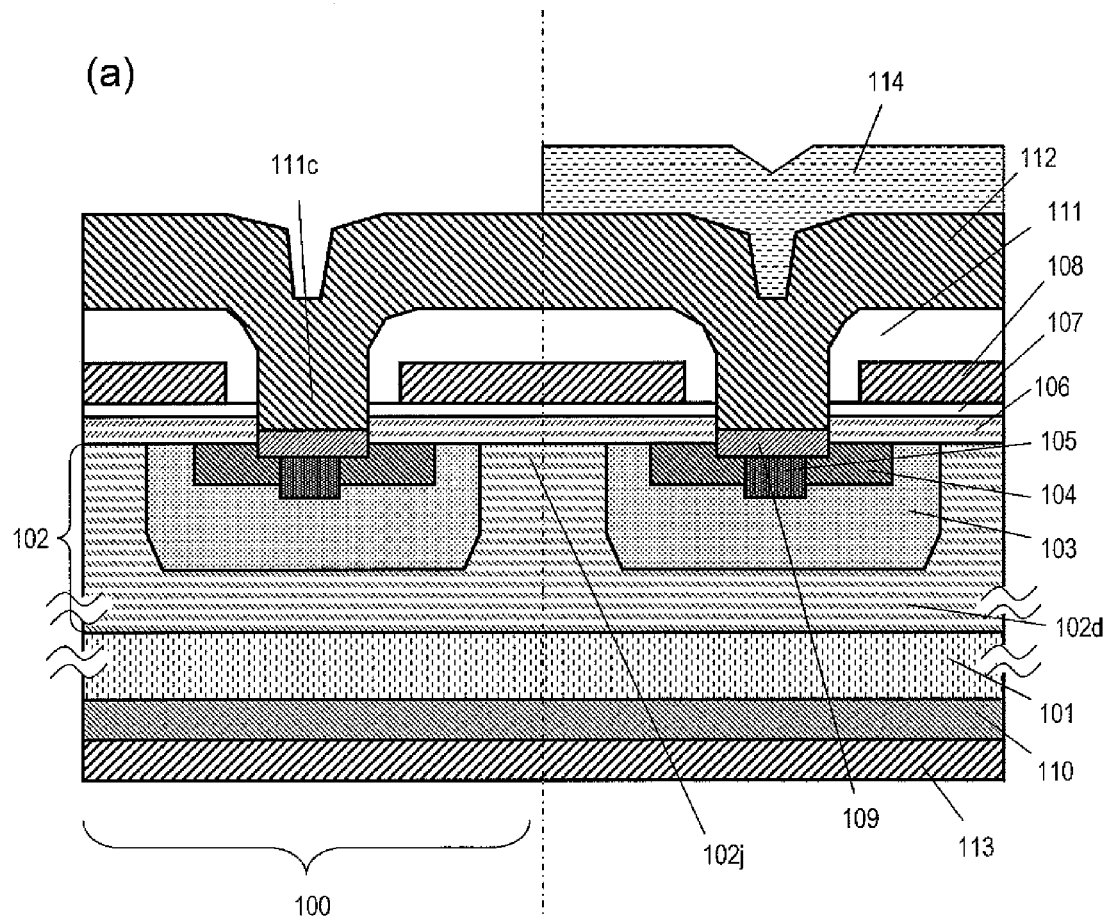
(b)
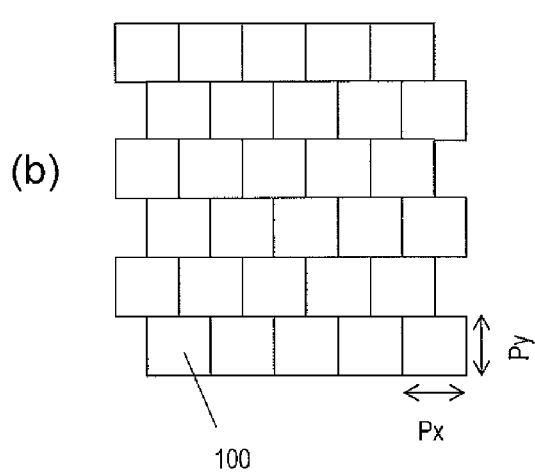
(c)
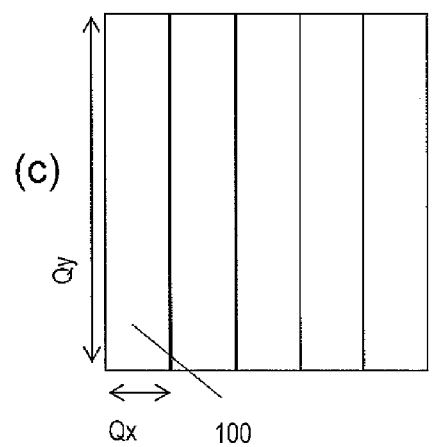

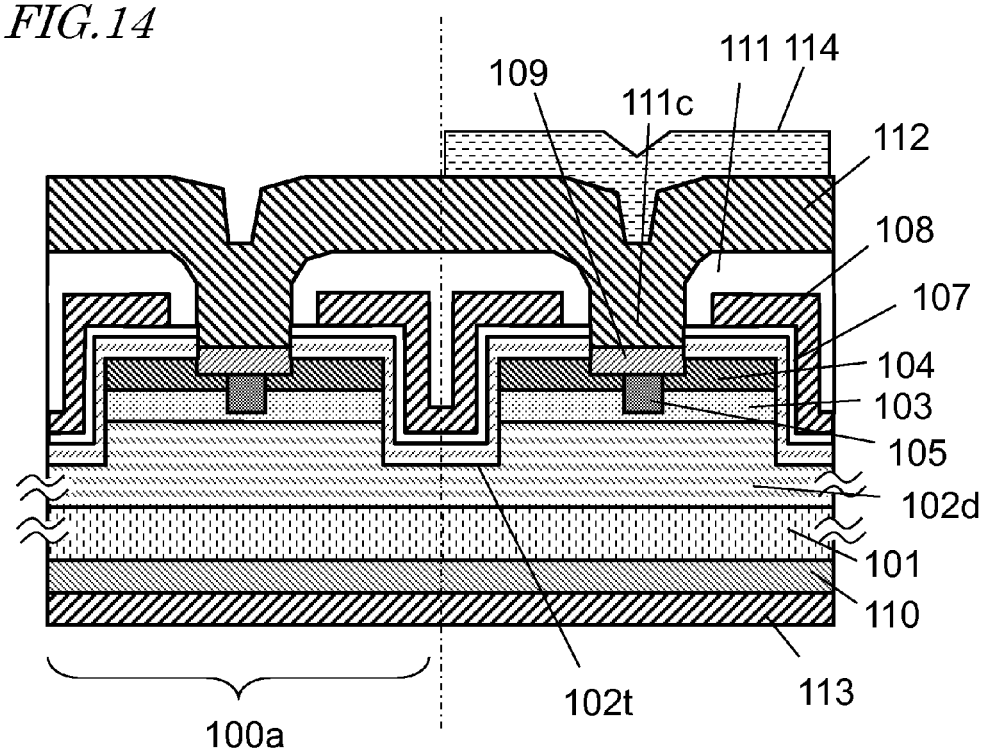
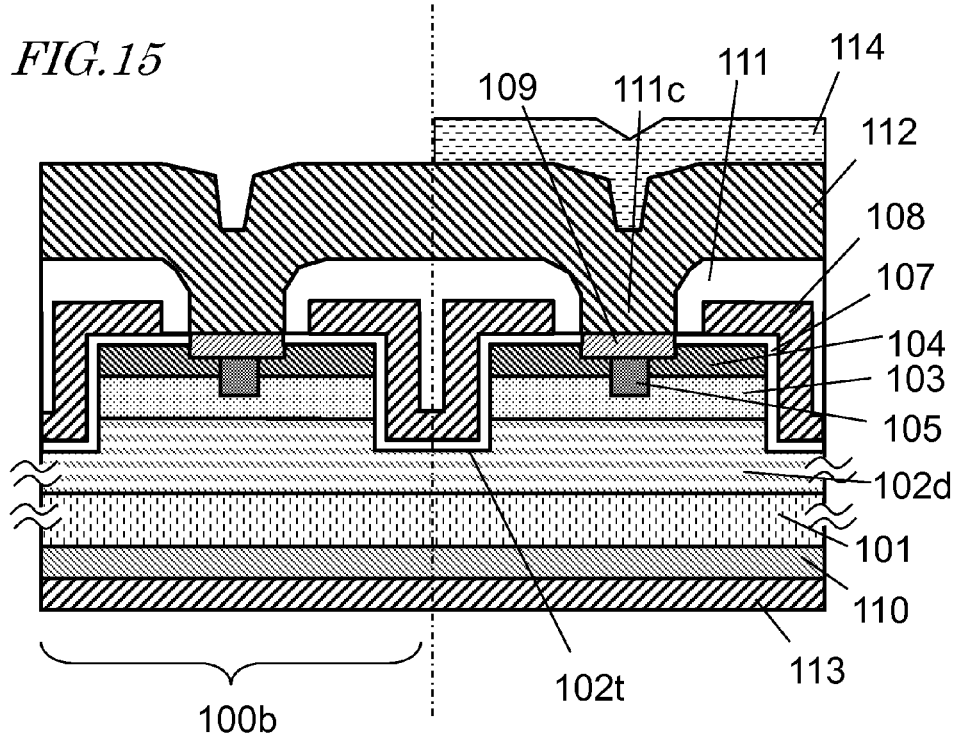

SEMICONDUCTOR CHIP WITH LINEAR EXPANSION COEFFICIENTS IN DIRECTION PARALLEL TO SIDES OF HEXAGONAL SEMICONDUCTOR SUBSTRATE AND MANUFACTURING METHOD

TECHNICAL FIELD

The present invention relates to a semiconductor chip, a semiconductor wafer, and a semiconductor chip manufacturing method. More particularly, the present invention relates to a semiconductor chip, a semiconductor wafer, and a semiconductor chip manufacturing method that use a hexagonal semiconductor having anisotropic mechanical properties in a direction parallel to a principal surface, such as silicon carbide or gallium nitride.

BACKGROUND ART

In semiconductor devices, there has conventionally been used a silicon (Si) substrate. In recent years, wide-band gap semiconductor materials such as silicon carbide (SiC) and gallium nitride (GaN) are attracting attention in the field of power semiconductor devices, and are being developed.

Wide-band gap semiconductors are semiconductor materials with a high degree of hardness that are wider in band gap than Si. Research is conducted to put into practical use various semiconductor devices that make use of the physical properties of wide-band gap semiconductors, such as power elements, environmentally-resistant elements, high-temperature operating elements, and high-frequency elements. Application of the wide-band gap semiconductors to power elements, in particular, such as switching elements and rectifier elements, is attracting attention, because the power elements that use SiC or GaN have advantages including a significant reduction in power loss as compared to that of Si power elements.

As the power elements using SiC or GaN, there have been reported a metal-insulator-semiconductor field effect transistor (hereinafter referred to as MISFET), a junction field effect transistor (hereinafter referred to as JFET), a p-n junction diodes, and a Schottky barrier diode. Such power elements may realize an on state where a current of several amperes (A) or higher flows and an off state where the current is zero while as high a withstand voltage of several hundred volts or higher is maintained.

The wide-band gap semiconductors may also maintain their semiconductor characteristics in a high-temperature environment, and great expectations are placed on SiC and GaN as a power element capable of operating in a high-temperature environment (for example, 200° C. or higher), which is not feasible with Si.

Those power elements are obtained by forming a plurality of elements on a wafer which is made mainly from a semiconductor and dividing the wafer into chips. Hereinafter, a wafer, before power semiconductor elements or the like are formed, is referred to simply as "wafer" and a wafer, on which power semiconductor elements or the like have been formed, is referred to as "semiconductor wafer". The term wafer also includes one that has an epitaxial layer on the principal surface (front surface) or the rear surface.

In the case of a wafer made from a single-crystal semiconductor, a "cutout" called an orientation flat or a notch is provided in the circumference of the wafer in order to indicate the crystal orientation of the wafer. The orientation flats or notches in wafers are used in a semiconductor manufacturing process to align the crystal orientations of the wafers. This significantly reduces fluctuations in many semiconductor element characteristics that are dependent on the crystal orientation. The arrangement of semiconductor elements on a wafer is disclosed in, for example, Patent Document Nos. 1 to 6.

FIGS. 18($a$) and 18($b$) are schematic diagrams illustrating respectively a semiconductor wafer with orientation flats and a semiconductor wafer with a notch on which a plurality of square-shaped power semiconductor devices are arranged. As illustrated in FIG. 18($a$), a semiconductor wafer 1001 includes a wafer that has an orientation flat 1001$a$ and a second orientation flat 1001$b$ and a plurality of power semiconductor devices 1010. Usually, the orientation flat 1001$a$ and the second orientation flat 1001$b$ are orthogonal to each other, and the plurality of the power semiconductor devices 1010 are formed on the wafer so that two sides of each of the plurality of the power semiconductor devices 1010 are parallel to the orientation flat 1001$a$ and the second orientation flat 1001$b$.

A direction determined by the orientation flat 1001$a$ is defined herein as a direction parallel to the orientation flat 1001$a$ (the orientation flat longer in the straight line direction) as indicated by an arrow 1005 of FIG. 18($a$).

As illustrated in FIG. 18($b$), a semiconductor wafer 1001' includes a wafer that has a notch 1001$c$ and a plurality of power semiconductor devices 1010. The plurality of power semiconductor devices 1010 are formed on the wafer so that one side of each of the plurality of power semiconductor devices 1010 is parallel to a direction of an arrow 1005' which is determined by the cutout of the notch 1001$c$.

Arranging the plurality of power semiconductor devices 1010 cyclically on the wafer facilitates the separation of the power semiconductor devices 1010 from one another. The power semiconductor devices 1010 are separated from one another along orthogonal cutting lines (hereinafter also referred to as scribe lines) 1020$x$ and 1020$y$. Usually, unless there are no restrictions in shape, semiconductor chips which are obtained by separating the power semiconductor devices 1010 from one another each having a substantially square shape on a plane parallel to the front surface of the original semiconductor wafer 1001 or 1001'.

CITATION LIST

Patent Literature

Patent Document No. 1: Japanese Patent Application Laid-Open Publication No. 2007-73700
Patent Document No. 2: Japanese Patent Application Laid-Open Publication No. 2008-227205
Patent Document No. 3: Japanese Patent Application Laid-Open Publication No. 11-340576
Patent Document No. 4: Japanese Patent Application Laid-Open Publication No. 2002-170992
Patent Document No. 5: Japanese Patent Application Laid-Open Publication No. 02-275614
Patent Document No. 6: Japanese Patent Application Laid-Open Publication No. 2004-14709
Patent Document No. 7: Japanese Patent Application Laid-Open Publication No. 2007-81096

Non-Patent Literature

Non Patent Document No. 1: Z. Li et al., J. Am. Ceram. Soc., 70 [7] 445-48 (1987)

Non Patent Document No. 2: H. Morkoc, Handbook of Nitride Semiconductors and Devices, Vol. I, p. 17

SUMMARY OF INVENTION

Technical Problem

Si which has conventionally been used widely in power semiconductor devices, is a cubic semiconductor and exhibits isotropic mechanical properties without anisotropy originating from crystal orientation. SiC and GaN, on the other hand, are hexagonal semiconductors and are known to have anisotropic mechanical properties. For example, Non patent Document Nos. 1 and 2 respectively disclose that the linear expansion coefficient of SiC and the linear expansion coefficient of GaN are anisotropic due to the crystal orientation. Patent Document No. 7 also discloses that, although not mechanical properties, the heat conductivity of SiC is anisotropic due to the crystal orientation.

The inventors of the present invention have manufactured a power semiconductor device that uses SiC and assessed reliability to find out a drop in the reliability of the power semiconductor device which is caused presumably by the anisotropic mechanical properties described above.

The present invention has been made in view of those points, and an object of the present invention is to provide a highly reliable semiconductor chip, a semiconductor wafer, and a semiconductor chip manufacturing method by using a semiconductor that has anisotropic mechanical properties due to crystal orientation.

Solution to Problem

According to the present invention, there is provided a semiconductor chip on which a power semiconductor device is formed and which includes a semiconductor substrate made from a hexagonal semiconductor, in which the semiconductor substrate has a shape of a rectangle on a principal surface, in which the rectangle is defined by two sides having lengths a and b equal to each other, and in which linear expansion coefficients in directions parallel to the two sides of the semiconductor substrate are equal to each other.

Further, according to the present invention, there is provided a semiconductor chip on which a power semiconductor device is formed and which includes a semiconductor substrate made from a hexagonal semiconductor, in which the semiconductor substrate has the shape of a rectangle on a principal surface, in which the rectangle is defined by two sides having lengths a and b equal to each other, and in which one of the two sides and a <11-20> direction of the hexagonal semiconductor form an angle of 15°, and another of the two sides and a <1-100> direction of the hexagonal semiconductor form an angle of 15°.

In a preferred embodiment, the power semiconductor device includes: a power semiconductor element formed on the semiconductor substrate; and a protective film which is provided on the semiconductor substrate so as to cover the power semiconductor element at least partially, and which has an isotropic mechanical property.

In a preferred embodiment, the power semiconductor device includes element is formed on the principal surface of the semiconductor substrate, and includes an epitaxial layer made from the same material as the semiconductor substrate.

In a preferred embodiment, the protective film contains at least one of silicon nitride and silicon oxide.

In a preferred embodiment, the power semiconductor element includes a wiring electrode that has an isotropic mechanical property.

In a preferred embodiment, the wiring electrode is made from aluminum, copper, or an alloy that contains at least one of aluminum and copper.

In a preferred embodiment, the principal surface of the semiconductor substrate and a (0001) plane or (000-1) plane of the hexagonal semiconductor form an angle θ, which satisfies the following expression.

$$-10° \leq \theta \leq 10°$$

In a preferred embodiment, the semiconductor substrate is a silicon carbide semiconductor substrate.

In a preferred embodiment, the semiconductor substrate is a gallium nitride semiconductor substrate.

In a preferred embodiment, the power semiconductor element is one selected from the group consisting of a metal-insulator-semiconductor field effect transistor, a p-n junction diode, and a Schottky barrier diode.

In a preferred embodiment, the power semiconductor element is a switching element or a rectifier element.

According to the present invention, there is provided a semiconductor wafer, including: a wafer made from a hexagonal semiconductor; and a plurality of power semiconductor devices formed on the wafer, in which the wafer has an anisotropic mechanical property due to crystal orientation on a plane parallel to a principal surface, in which the wafer is provided with a mark for determining a crystal direction of the hexagonal semiconductor in at least a part of a circumference of the wafer, in which a direction determined by the mark and a <11-20> direction or <1-100> direction of the hexagonal semiconductor form an angle β, which satisfies the following Expression:

$$-5 \leq \beta \leq 5°$$

in which the plurality of power semiconductor devices each has an area defined by a rectangle on the principal surface, in which the rectangle is defined by two sides having one side forming an angle γ with the direction determined by the mark, and the angle γ satisfies the following Expression (1) or (1').

$$10° \leq \gamma \leq 20° \quad (1)$$

$$40° \leq \gamma 50° \quad (1')$$

In a preferred embodiment, the mark is an orientation flat.

In a preferred embodiment, the mark is a notch.

According to the present invention, there is provided a semiconductor wafer, including: a wafer made from a hexagonal semiconductor; and a plurality of power semiconductor devices formed on the wafer, in which the wafer has an anisotropic mechanical property due to crystal orientation on a plane parallel to a principal surface, in which the wafer is provided with a mark for determining a crystal direction of the hexagonal semiconductor in at least a part of a circumference of the wafer, in which a direction determined by the mark and a <11-20> direction or <1-100> direction of the hexagonal semiconductor form an angle β', which satisfies a relation 10°≤β'≤20°, and in which the plurality of power semiconductor devices each has an area defined by a rectangle on the principal surface of the wafer.

According to the present invention, there is provided a semiconductor chip manufacturing method, including the steps of: dividing a semiconductor wafer, which includes a wafer made from a hexagonal semiconductor and a plurality of power semiconductor devices formed on the wafer, a plurality of times in parallel to a second direction, which is at an angle of 90° with a first direction, while moving the semiconductor wafer relative to a dividing position of a wafer dividing device for a distance c at a time in the first direction, which is at an angle of 15° with a <11-20> direction or <1-100> direction of the hexagonal semiconductor; rotating strips of the semiconductor wafer, which are obtained by the division, by 90° relative to the wafer dividing device; and dividing the strips of the semiconductor wafer, which are obtained by the division, a plurality of times in parallel to the first direction, while moving the strips of the semiconductor wafer relative to the dividing position of the wafer dividing device for the distance c at a time in the second direction.

Advantageous Effects of Invention

According to the semiconductor chip of the present invention, linear expansion coefficients in directions parallel to two sides that define the rectangular shape of the semiconductor substrate are equal to each other. This relieves the concentration of strain and stress in one direction of the semiconductor chip. The concentration of stress is relieved also when the semiconductor chip is housed in a package because the substantially square shape of the semiconductor chip makes stress applied from the package to the four corners of the semiconductor chip equal to one another. Accordingly, even when there is a large temperature difference between the upper limit value and the lower limit value of a use temperature range, a crack in a power semiconductor element or in an insulating thin film on the power semiconductor element, deformation of a wiring electrode, and the like are reduced and high reliability is accomplished.

According to the semiconductor wafer of the present invention, the mark for determining the crystal direction of the hexagonal semiconductor is provided in at least the part of the circumference of the wafer, and the direction determined by the mark is substantially parallel to the <11-20> direction or the <1-100> direction of the hexagonal semiconductor. The angle γ formed by one of the two sides that determine the rectangular area of the power semiconductor device and the direction that is determined by the mark satisfies 10°≤γ≤20° or 40°≤γ≤50°. This makes mechanical property values such as the linear expansion coefficient and Young's modulus of the hexagonal semiconductor substantially equal in the directions of the two orthogonal sides. A semiconductor wafer from which the semiconductor chip described above can be cut out is thus realized.

According to the semiconductor chip manufacturing method of the present invention, a semiconductor chip that has the structure described above can be manufactured.

BRIEF DESCRIPTION OF DRAWINGS

FIGS. 7(a) and 7(b) are respectively a graph showing the relation of a rotation angle δ of FIG. 6 with the linear expansion coefficients of silicon carbide in an x-axis direction and a y-axis direction and a graph showing the relation of the rotation angle δ with the Young's moduli of silicon carbide in the x-axis and y-axis directions.

FIGS. 8(a) and 8(b) are respectively a graph showing the relation of the rotation angle δ of FIG. 6 with the linear expansion coefficients of gallium nitride in the x-axis and y-axis directions and a graph showing the relation of the rotation angle δ with the Young's moduli of gallium nitride in the x-axis and y-axis directions.

FIG. 11(a) is a schematic sectional view illustrating the structure of a double implantation MISFET with a channel layer which is an example of the semiconductor chip according to the present invention, and FIGS. 11(b) and 11(c) are plan views illustrating an example of arrangement of unit cells.

FIG. 14 is a schematic sectional view illustrating the structure of a trench MISFET with a channel layer which is still another example of the semiconductor chip according to the present invention.

FIG. 15 is a schematic sectional view illustrating the structure of a trench MISFET without a channel layer which is yet still another example of the semiconductor chip according to the present invention.

DESCRIPTION OF EMBODIMENTS

Figure 18:
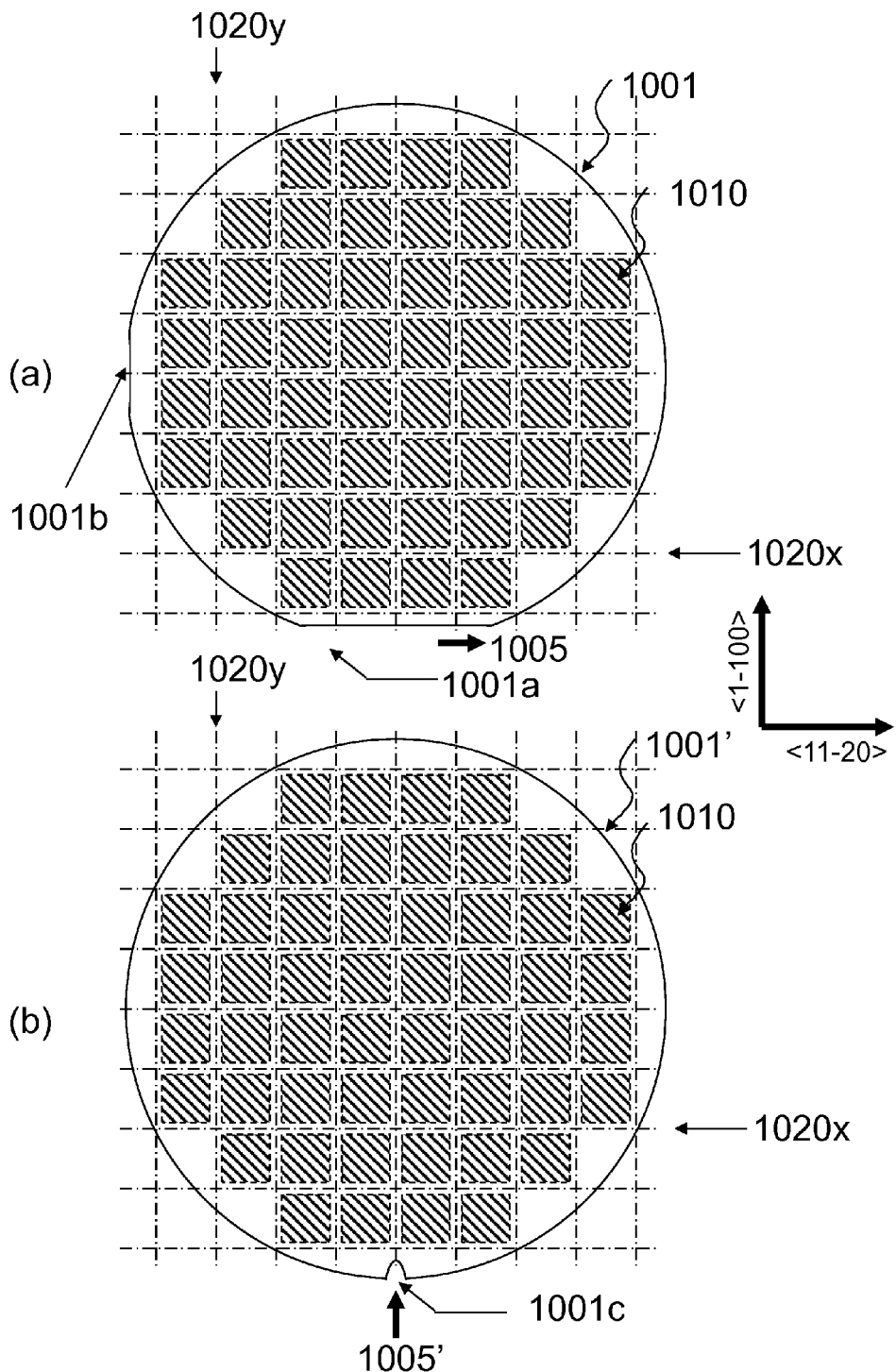
FIGS. 18(a) and 18(b) are each a plan view illustrating a conventional semiconductor wafer.

In order to assess the reliability of an SiC device, the inventors of the present invention manufactured a 3.6 mm-square power semiconductor device 1010 having a MISFET structure by using, as a semiconductor wafer 1001, a 4H—SiC wafer whose principal surface is off-cut by approximately 4° from a (0001) plane toward a <11-20> direction as illustrated in FIG. 18(a). The symbol "-" attached in front of a numerical value of the Miller index herein represents a bar of the numerical value that follows. For example, the third index of the <11-20> orientation represents "2 bar". The surface of the power semiconductor device is partially covered with a protective film which uses SiN. The semiconductor wafer 1001 was cut along scribe lines 1020x and 1020y to be broken into semiconductor chips each including the power semiconductor device 1010. The semiconductor chips were then assembled into packages under package assembly conditions A, B, and C which ensures a satisfactory reliability for MISFET structure power semiconductor elements made from Si. The packaged devices were tested by a temperature cycle test which is a common reliability assessment test and in which temperature is repeatedly raised and dropped between −65° C. and 150° C. For comparison, power semiconductor devices were similarly manufactured from Si, assembled into packages, and subjected to the temperature cycle test.

The package assembly here includes steps of electrically connecting and fixing the semiconductor chip to a metal lead frame with solder or the like, forming an aluminum wire or the like between the lead frame and the semiconductor chip, and sealing the semiconductor chip with an epoxy-based resin material. In general, a polyimide-based material called junction coating resin (JCR) is applied before the power semiconductor element is sealed with resin in some cases.

Herein, a component part that has a desired function as a device such as a MISFET or a diode is referred to as a power semiconductor element, whereas a component part that includes a power semiconductor element, a perimeter portion formed around the power semiconductor element, and a protective film that covers, at least partially, the power semiconductor element and the perimeter portion is referred to as a power semiconductor device. Pieces of a semiconductor wafer with a plurality of power semiconductor devices formed thereon which are obtained by dividing the semiconductor wafer along scribe lines are referred to as semiconductor chips. The semiconductor chips each include a semiconductor substrate which is a broken piece of the wafer. A structure in which a semiconductor chip is housed in a package is referred to as a semiconductor device.

As described above, the package assembly conditions A, B, and C ensure reliability for Si semiconductor devices. Consequently, after repeating the temperature cycle test on the assembled Si devices 300 times, there were practically no defective devices and the accumulative device defect ratio was substantially zero. An observation of the element surface after opening the sealing resin also found no anomalies in form such as a crack in the protective film and a slide of a wiring electrode.

Figure 19:
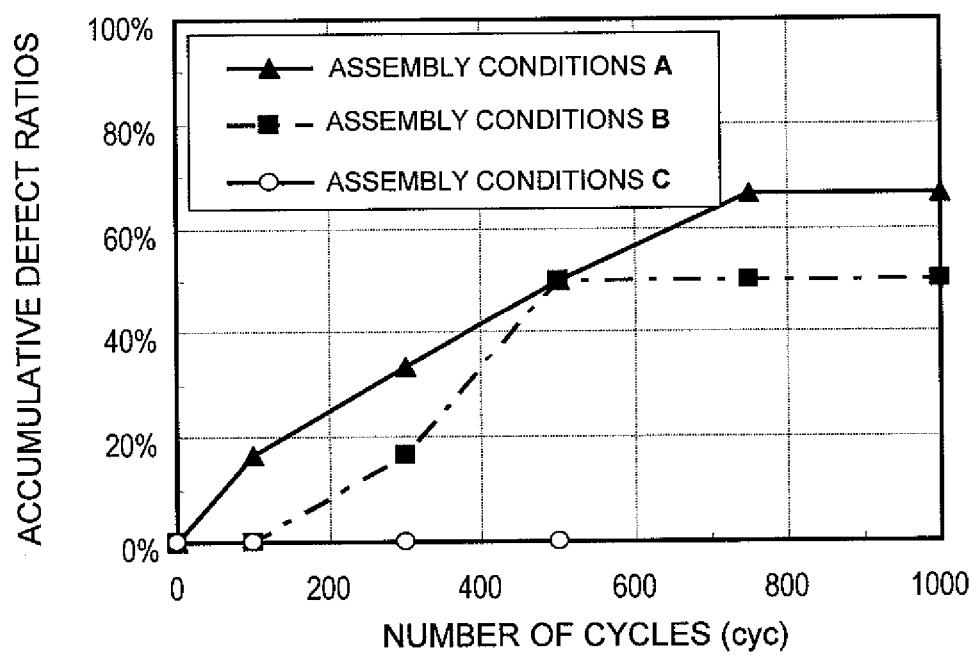
FIG. 19 is a graph showing accumulative defect ratios in assembled SiC semiconductor devices.

Results of the temperature cycle test on the devices that use 4H—SiC are shown in FIG. 19. As shown in FIG. 19, defects started to appear from the 100th time under the assembly conditions A and B. The accumulative chip defect ratio under the assembly condition C was substantially zero. However, an observation of the element surface after opening the sealing resin confirmed, in addition to a crack in the semiconductor itself, a crack in the protective film and a slide of an aluminum electrode connected to a source electrode. A slide refers to an electrode surface being pulled in a direction parallel to the surface and consequently developing wrinkles or peeling in places. It is understood from those results that the defect ratio of SiC devices is high in a temperature cycle test even under assembly conditions that have been proven to work for Si devices. In other words, it is difficult to realize an SiC device of satisfactory reliability by simply applying conventional manufacturing methods and structures of Si devices as they are to an SiC device.

As a result of an in-depth study, it was estimated that the defects of the packaged devices in the temperature cycle test were caused by the fact that SiC was a hexagonal semiconductor and had anisotropic mechanical properties due to crystal orientation. When mechanical properties, for example, linear expansion coefficient is anisotropic due to the crystal orientation of the semiconductor substrate, the semiconductor substrate expands and shrinks to an enhanced degree in a specific crystal orientation in response to a change in temperature. Heat deformation and stress due to the expansion and shrinkage of the semiconductor itself are one of factors for a crack in the protective film which protects the perimeter of the power semiconductor element and others and a slide of a part of a wiring electrode formed inside the power semiconductor element, thereby causing malfunction of the device or a change in device characteristics. This is presumably why packaging methods and package structures that do not lead to defects in Si devices having isotropic mechanical properties cause defects in SiC or GaN devices.

SiC is considered as a material with which a device superior in heat resistance to Si is realized. Therefore, when an SiC device is used at a temperature higher than one at which a Si device is used, a temperature difference ($\Delta T$) between the normal temperature and the use temperature is greater than in the case of a Si device. The increased temperature difference may cause troubles that are difficult to anticipate from the case of a Si device or may facilitate the defects described above. In addition, the temperature of a power semiconductor device including a rectifier element and a switching element which operate on large power tends to be high also from operating power. Solving such problems is therefore particularly important in a power semiconductor device including a rectifier element and a switching element which are made from SiC or GaN semiconductor material, and which operate on large power.

Based on this knowledge, the inventors of the present invention found out that the influence of anisotropic mechanical properties at the semiconductor chip stage was reduced by the arrangement of power semiconductor devices on a semiconductor wafer, more specifically, by selecting an appropriate combination of a wafer crystal orientation and directions of two sides that define an area of each power semiconductor device on the principal surface of the semiconductor wafer.

A semiconductor chip of the present invention has a power semiconductor device formed thereon, and includes a semiconductor substrate made from a hexagonal semiconductor. The semiconductor substrate has a principal surface shaped like a rectangle, has equal lengths as lengths a and b of two sides that define the rectangle, and has equal linear expansion coefficients in directions parallel to the two sides of the semiconductor substrate.

Herein, cases where "the lengths a and b of two sides are equal" include a case where the lengths a and b match completely with each other and a case where a relation $0.95b \leq a \leq 1.05b$ is satisfied. Cases where "linear expansion coefficients in directions parallel to the two sides of the semiconductor substrate are equal to each other" include a case where the linear expansion coefficients along the two sides match completely with each other and a case where the difference between the linear expansion coefficients along the two sides is within 5%.

A semiconductor chip, a semiconductor wafer, and a semiconductor chip manufacturing method according to embodiments of the present invention are described below with reference to the drawings.

First Embodiment

A description is given below with reference to the drawings of a semiconductor chip and a semiconductor wafer according to an embodiment of the present invention. Throughout the drawings, components that have substantially the same function are denoted by the same reference symbols for easier understanding. It should be noted that the present invention is not limited to the following embodiments.

Figure 1:
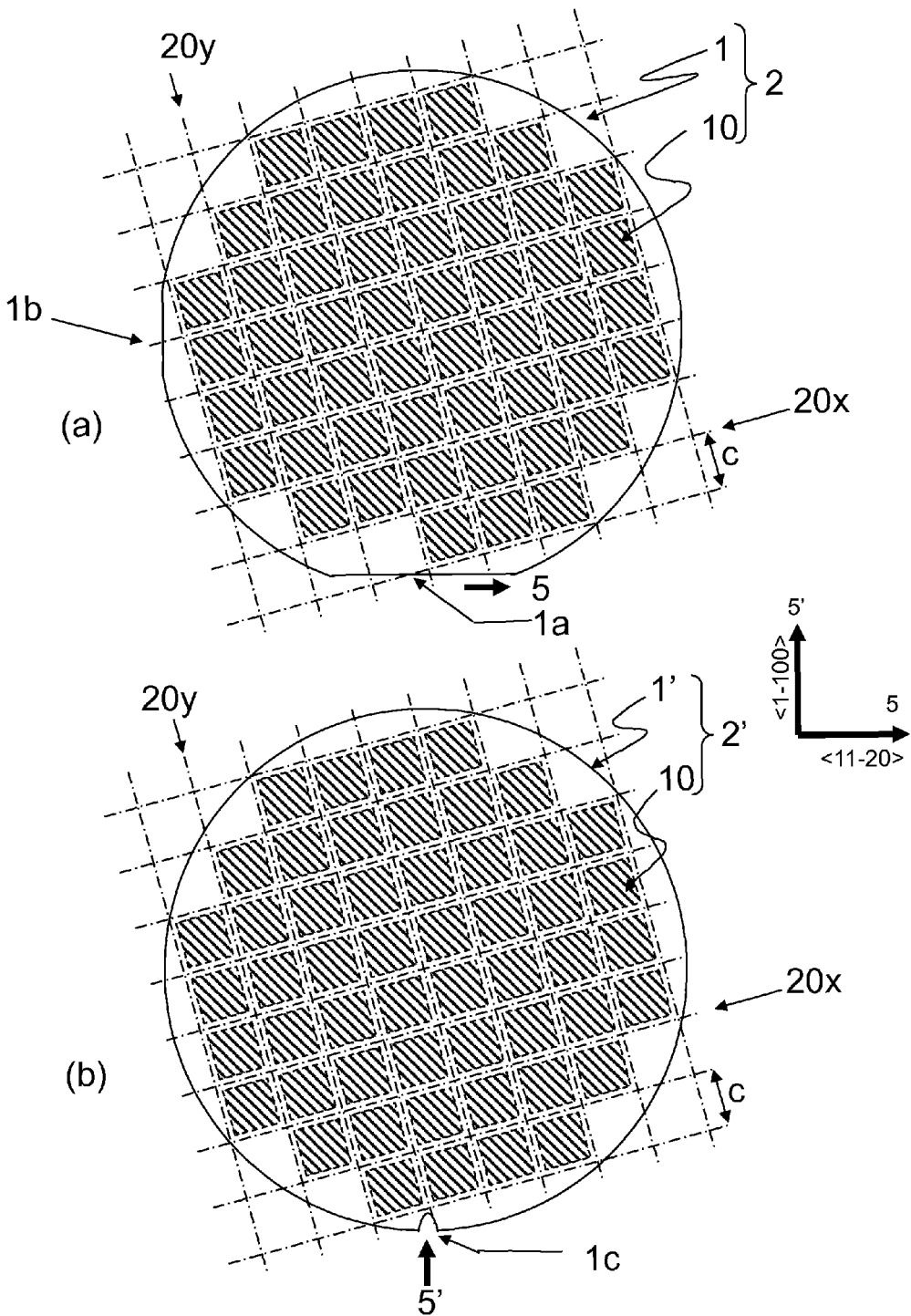
FIGS. 1(a) and 1(b) are plan views each illustrating a semiconductor wafer according to an embodiment of the present invention.

FIGS. 1(a) and 1(b) are each a plan view illustrating a semiconductor wafer according to an embodiment of the present invention, and each show the principal surface of the semiconductor wafer. A semiconductor wafer 2 illustrated in FIG. 1(a) and a semiconductor wafer 2' illustrated in FIG. 1(b) respectively include a wafer 1 and a wafer 1' which are made from a hexagonal semiconductor. More specifically, the wafers 1 and 1' are made from a single-crystal semiconductor of SiC or GaN. The wafers 1 and 1' may be just substrates or may be off-cut substrates. Specifically, it is sufficient if an angle θ between the principal surface of the wafer 1 or 1' and a (0001) plane or (000-1) plane of the hexagonal semiconductor satisfies a relation of $-10°≤θ≤10°$.

Figure 2:
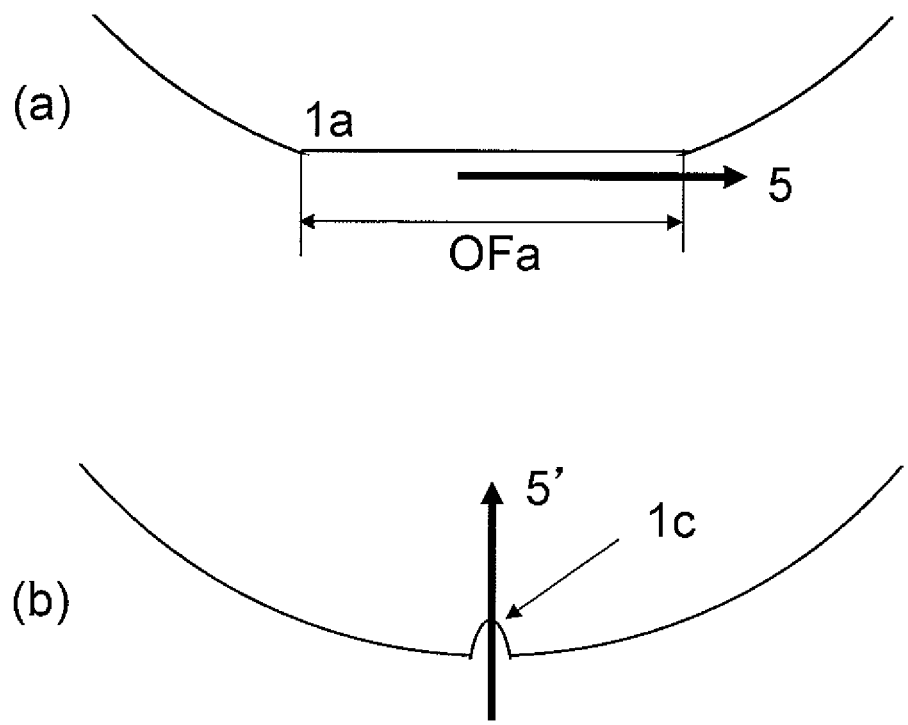
FIGS. 2(a) and 2(b) are schematic plan views illustrating marks and directions of the semiconductor wafers of FIG. 1(a) and FIG. 1(b), respectively.

Marks for determining the crystal direction of the hexagonal semiconductor that forms the wafers 1 and 1' are provided in the circumferences of the wafers 1 and 1'. As illustrated in FIG. 1(a), the semiconductor wafer 2 has an orientation flat 1a and a second orientation flat 1b which are provided in the circumference of the wafer 1. The second orientation flat 1b may be omitted. The orientation flat 1a and the second orientation flat 1b are each defined by a straight line (chord) that is formed by cutting out a part of the circle of the wafer 1 in parallel to a tangent of the circle. The orientation flat 1a and the second orientation flat 1b are orthogonal to each other, and the second orientation flat 1b is shorter in length than the orientation flat 1a. As illustrated in FIG. 2(a), the length of the orientation flat 1a is denoted by OFa. A direction 5 of the orientation flat 1a is parallel to the segment OFa and indicated by an arrow in FIG. 1(a) and FIG. 2(a). In other words, the direction 5 of the orientation flat 1a which is indicated by an arrow determines the crystal direction of the hexagonal semiconductor that forms the wafer 1.

A mark for determining the crystal direction may be a notch. As illustrated in FIG. 1(b), the semiconductor wafer 2' has a notch 1c which is provided in the circumference of the wafer 1'. The notch 1c is defined by a concave portion dented toward the center of the wafer 1'. As indicated by an arrow in FIG. 1(b) and FIG. 2(b), a direction 5' of the notch 1c is directed from the opening of the concave portion toward the bottom of the concave portion and further toward the center of the wafer 1'. In other words, the direction 5' of the notch 1c which is indicated by the arrow determines the crystal direction of the hexagonal semiconductor that forms the wafer 1'.

Figure 3:
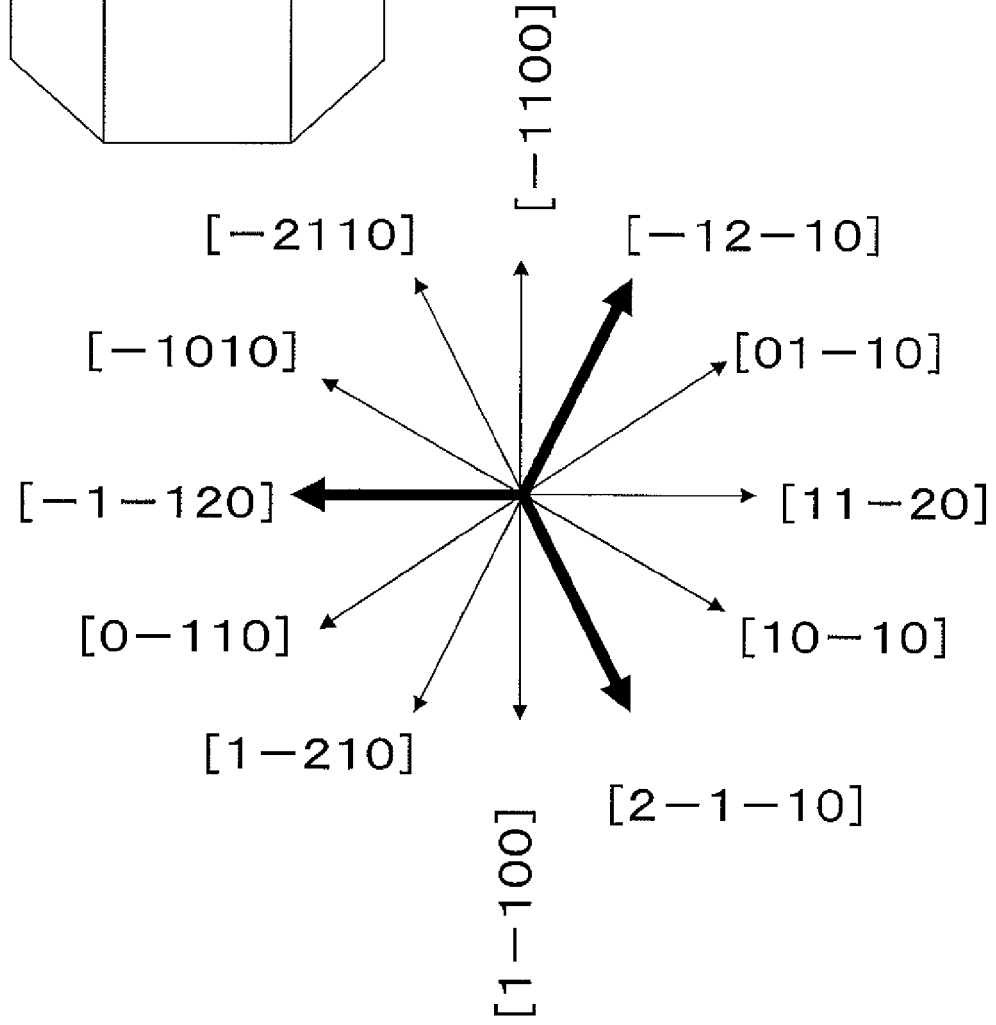
FIG. 3 is a diagram illustrating a <11-20> direction and a <1-100> direction in a hexagonal semiconductor.

As illustrated in FIG. 1(a), the direction 5 of the orientation flat 1a is parallel to the <11-20> direction which is the crystal orientation of the hexagonal semiconductor that forms the wafer 1, and an angle between the two directions is ideally zero. The <11-20> direction collectively represents [11-20], [-12-10], [-2110], [-1-120], [1-210], and [2-1-10] directions of the hexagonal semiconductor which are spaced from one another at an angle of 60° as illustrated in FIG. 3. As illustrated in FIG. 2(b), the direction 5' of the notch 1c is parallel to the <1-100> direction which is the crystal orientation of the hexagonal semiconductor that forms the wafer 1', and an angle between the two directions is ideally zero. The <1-100> direction collectively represents [01-10], [-1100], [-1010], [0-110], [1-100], and [10-10] directions in the hexagonal semiconductor as illustrated in FIG. 3. For example, in FIG. 1(a), the [11-20] direction is expressed as <11-20> and the [-1100] direction is expressed as <1-100> in order to simplify the description.

In this case, it can be said that the <11-20> direction and the <1-100> direction are orthogonal to each other and the direction 5 of the orientation flat 1a and the <1-100> direction can be deemed as orthogonal to each other. The direction 5' of the notch 1c and the <11-20> direction can also be deemed as orthogonal to each other.

Herein, "the <11-20> direction and the <1-100> direction are orthogonal to each other" means that, after one direction is defined out of a plurality of equivalent directions that is one of the two sets of collectively expressed directions described above, a direction orthogonal to the defined direction is chosen out of a plurality of equivalent directions that is the other set of collectively expressed directions.

In an actual wafer, the direction of an orientation flat or a notch is not strictly parallel to the crystal orientation described above due to a manufacturing error, and an error within ±5° or so may occur. It is therefore sufficient if an angle β between a direction determined by the mark for determining the crystal orientation which is the orientation flat 1a or the notch 1c and the <11-20> direction or the <1-100> direction satisfies a relation $-5°≤β≤5°$.

As illustrated in FIG. 1(a), the semiconductor wafer 2 includes the wafer 1, which is provided with the marks for determining the crystal orientation described above, and a plurality of power semiconductor devices 10 which are formed on the wafer 1. The semiconductor wafer 2, which is obtained by providing the plurality of power semiconductor devices on the above-mentioned wafer 1, too, satisfies the relation between the mark for determining the crystal orientation and the crystal orientation of the hexagonal semiconductor as described above. Each of the plurality of power semiconductor devices 10 has an area defined by a rectangle on the principal surface of the semiconductor wafer 2 as indicated by hatching. The angle γ between one of two sides that define the rectangle and the direction 5 of the orientation flat 1a satisfies a relation $10°≤γ≤20°$. More preferably, the angle γ satisfies a relation $12°≤γ≤18°$. Most preferably, the angle γ is 15°. Because the two sides defining the rectangle are orthogonal to each other and the <11-20> direction and the <1-100> direction are orthogonal to each other, an angle between the other one of the two sides defining the rectangle and the <1-100> direction satisfies the relation $10°≤γ≤20°$ as well.

As illustrated in FIG. 1(b), the semiconductor wafer 2', too, includes the wafer 1', which is provided with the mark for determining the crystal orientation described above, and a plurality of power semiconductor devices 10, which is formed on the wafer 1'. The semiconductor wafer 2', which is obtained by providing the plurality of power semiconductor devices on the above-mentioned wafer 1', too, satisfies the relation between the mark for determining the crystal orientation and the crystal orientation of the hexagonal semiconductor as described above. Each of the plurality of power semiconductor devices 10 has an area defined by a rectangle on the principal surface of the semiconductor wafer 2' as indicated by hatching. As described in detail below, the angle γ between one of two sides that define the rectangle and the direction 5' of the notch 1c satisfies a relation $10°≤γ≤20°$. More preferably, the angle γ satisfies a relation $12°≤γ≤18°$. Most preferably, the angle γ is 15°.

Herein, cases where "the angle γ between one of the two sides defining the rectangle and the direction of the mark for determining the crystal orientation is 15°" include a case where this angle is exactly 15° and a case where the angle satisfies a relation $14.5°≤γ≤15.4°$.

The plurality of power semiconductor devices 10 formed on the semiconductor wafer 2 or 2' are linked to one another on the semiconductor wafer 2 or 2' by the wafer 1 or 1'. The power semiconductor devices 10 are separated from one another by dividing the semiconductor wafer 2 or 2' along cutting lines 20x and 20y. A dicing saw, for example, is used for the division. A cutting margin of 100 μm is prepared for the dicing saw and, when the power semiconductor devices 10 each have a 3.6-mm square size, the cutting lines 20x and 20y are set at equal pitches of 3.7 mm. In the case where the actual cutting margin is 50 μm, the cutting margin remainder is 50 μm, which makes each cut out power semiconductor device 10 having a substantially square shape a 3.65-mm square semiconductor chip.

Figure 4:
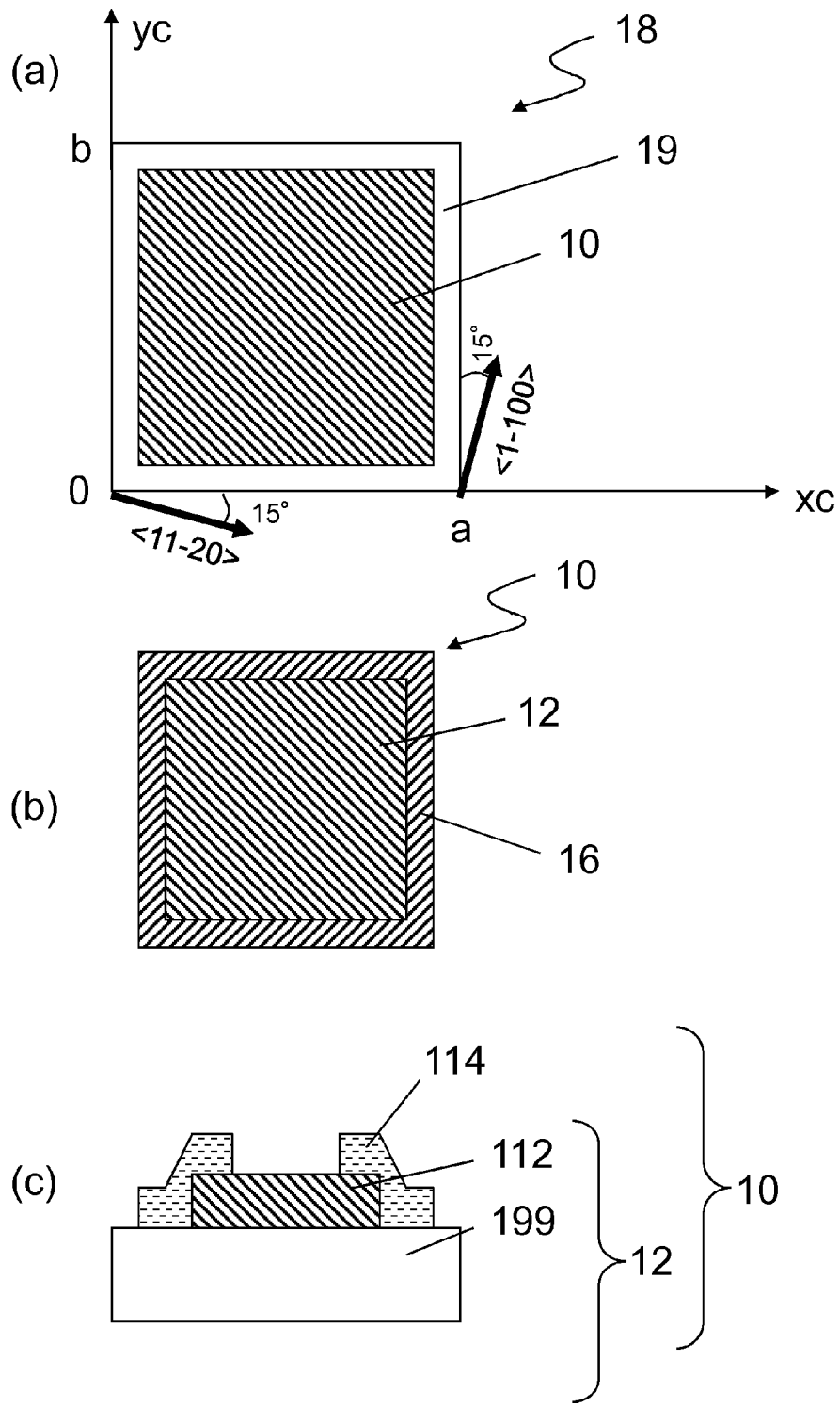
FIG. 4(a) is a schematic plan view illustrating a semiconductor chip according to an embodiment of the present invention, and FIGS. 4(b) and 4(c) each are a schematic plan view and a sectional view of a power semiconductor device that is included in the semiconductor chip of FIG. 4(a).

The cut out semiconductor chip is outlined in FIG. 4. FIG. 4(a) illustrates a semiconductor chip 18. The semiconductor chip 18 is constituted of the power semiconductor device 10 and a cutting margin remainder 19. The power semiconductor device 10 includes, as described below, a semiconductor substrate which is a broken piece of the wafer 1 or 1'. The cutting margin remainder 19, too, is a piece of the semiconductor substrate which has constituted the semiconductor wafer 2 or 2'. The semiconductor chip 18 therefore includes a semiconductor substrate sized to contain an area where the power semiconductor device 10 is formed and the cutting margin remainder 19. The cutting margin remainder has no significance in terms of semiconductor element operation, and the power semiconductor device 10 is therefore substantially equivalent to the semiconductor chip 18. The semiconductor chip has, in the example described above, a 3.7-mm square size.

Directions of two orthogonal sides on the principal surface of the semiconductor chip 18 are denoted by xc and yc. The directions xc and yc of the two orthogonal sides of the semiconductor chip 18 are also the directions of two sides that define the rectangular area of the power semiconductor device 10. When an angle between xc and the <11-20> direction is defined as α, an angle between yc and the <1-100> direction, too, is α.

When the lengths of two sides defining the substantially square shape of the semiconductor chip 18 are given as a and b, the lengths a and b of the two sides are preferably equal to each other. Cases where "the lengths a and b of the two sides are equal to each other" include a case where the lengths a and b match completely with each other, and a case where an error within 5% or so has occurred in terms of length in the process of manufacture. Specifically, "the lengths a and b are equal to each other" means that a relation $0.95b \leq a \leq 1.05b$ is satisfied. Values measured at room temperature (25° C.) are used as the lengths of the sides.

Figure 5:
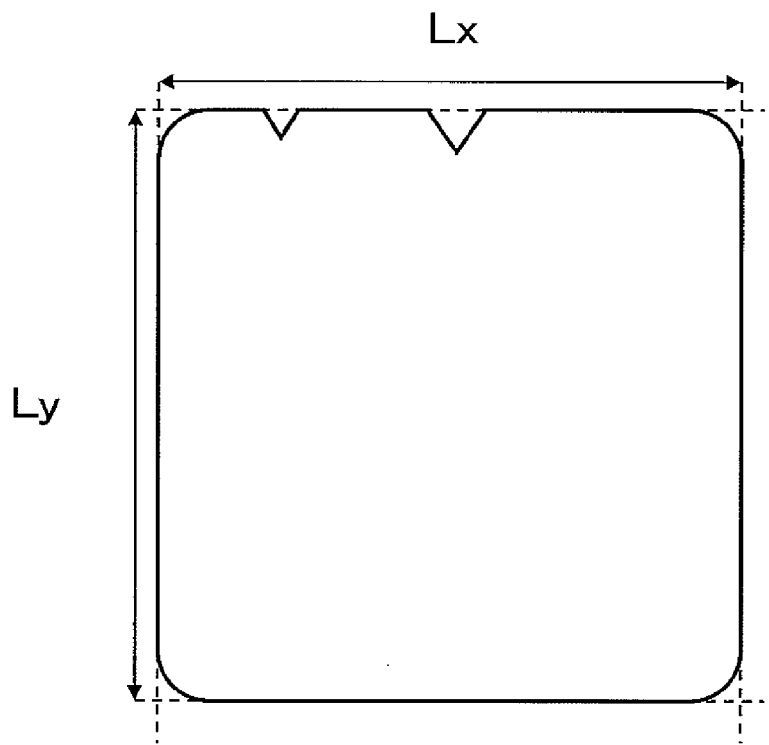
FIG. 5 is a schematic diagram illustrating the lengths of two sides of the semiconductor chip.

In addition, the lengths of the two sides respectively represent gaps Lx and Ly between two pairs of opposing sides which define the rectangle as illustrated in FIG. 5. In the case where the four corners of the rectangle are rounded or a side is notched in places as illustrated in FIG. 5, the rounded corners or the notch are ignored in measuring the lengths of the sides.

The lengths a and b of the two sides of the semiconductor chip 18 are readily measured by observing the cut out wafer of the semiconductor chip 18 with a microscope that has a scale. The crystal orientation can be analyzed with an X-ray diffractometer. The crystal orientation can be known also from a cleaving plane (or a cleaving direction) because a chip is cleaved along the crystal direction. For example, the cleaving direction in a 4H—SiC (0001) substrate is <11-20>.

The length of the side in the direction xc and the length of the side in the direction yc are a and b, respectively, in FIG. 4(a) but may be reversed. What defines the substantially square shape of the semiconductor chip 18 is specifically a semiconductor substrate described below.

Because the power semiconductor device 10 is substantially equivalent to the semiconductor chip 18 as described above, when the lengths of the two sides defining the rectangular area of the power semiconductor device 10 are given as a and b, the lengths a and b of the two sides are equal to each other. Specifically, a relation $0.95b \leq a \leq 1.05b$ is satisfied.

FIGS. 4(b) and 4(c) are respectively a plan view and sectional view of the power semiconductor device 10. As illustrated in FIGS. 4(b) and 4(c), the power semiconductor device 10 includes a power semiconductor element 12, a perimeter portion 16, and a protective film 114, which covers the power semiconductor element 12. The power semiconductor element 12 constitutes a main part which fulfills the function of the power semiconductor device 10 such as a MISFET or a Schottky barrier diode as described above. The perimeter portion 16 constitutes, among others, a guard ring structure for enhancing the insulating properties of the power semiconductor device 10. The protective film 114 is a thin film having insulating properties, and protects the power semiconductor element and the perimeter portion 16 from oxygen and moisture contained in the use environment. The protective film 114 is made from a material having isotropic mechanical properties, for example, silicon oxide (SiOx), silicon nitride (SiNx), silicon oxynitride (SiOxNy), or organic resin.

The power semiconductor element 12 includes, at least, a lower region 199 and a wiring electrode 112, which is formed on a surface of the lower region 199. The wiring electrode 112 is made from a material having isotropic mechanical properties such as aluminum, copper, or an alloy that contains at least one of aluminum and copper.

The lower region 199 includes a semiconductor substrate which is a broken piece of the wafer 1 or 1' made from a hexagonal semiconductor. The lower region 199 may include an epitaxial layer formed on the semiconductor substrate from the same hexagonal semiconductor as the semiconductor substrate. Two sides on the principal surface of the semiconductor substrate are the two sides having the above-mentioned lengths a and b which define the area of the power semiconductor device 10.

As illustrated in FIGS. 1(a) and 1(b) and FIG. 4(a), one of features of the semiconductor wafers 2 and 2' and semiconductor chip 18 of this embodiment is that one side defining the area where the power semiconductor device 10 included in these is formed is at the angle α with the <11-20> direction or the <1-100> direction instead of being parallel to the <11-20> direction or the <1-100> direction. When β is 0°, one side defining the area where the power semiconductor device 10 is formed is at the angle α with a direction that is determined by a mark for determining the crystal orientation which is the orientation flat 1a or the notch 1c. This feature is described in detail below.

Figure 6:
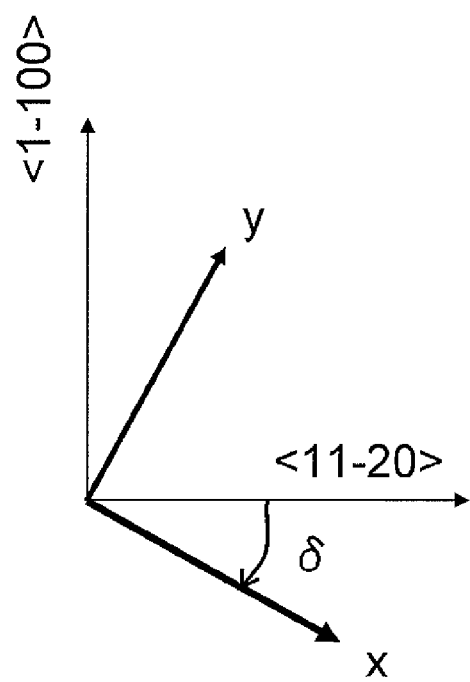
FIG. 6 is a conceptual diagram illustrating an angle relation between crystal orientations and sides of the semiconductor chip.

FIG. 6 schematically illustrates the crystal orientation of a hexagonal semiconductor viewed from the (0001) plane. In an orthogonal coordinate system that has the <11-20> direction and the <1-100> direction as two axes, an x-axis which is at a certain rotation angle δ with respect to the <11-20> direction of the crystal orientation and a y-axis orthogonal to the x-axis are defined. The rotation angle δ was varied to calculate the mechanical properties (linear expansion coefficients and Young's moduli) of the hexagonal semiconductor material in the x-axis direction and the y-axis direction by assuming a bonding power between molecules.

A physical property value that serves as a reference was obtained from an image acquired by conducting a 3D stereo measurement through digital image correction (DIC) with the use of a high-definition CCD camera. In the case of 4H—SiC which is a hexagonal semiconductor, the linear expansion coefficient in the <11-20> direction was calculated as $3.06 \times 10^{-6}/°$ C., the linear expansion coefficient in the <1-100> direction orthogonal thereto was $4.73 \times 10^{-6}/°$ C., and anisotropy in linear expansion coefficient was thus confirmed in the two orthogonal directions.

The Young's moduli were similarly measured in the <11-20> direction and in the <1-100> direction perpendicular to the <11-20> direction. As a result, the Young's modulus in the <11-20> was calculated as 454 GPa, the Young's modulus in the <1-100> direction was 601 GPa, and anisotropy in Young's modulus was thus confirmed as well in the two orthogonal directions.

FIGS. 7(a) and 7(b) respectively show results of calculating the linear expansion coefficients and Young's moduli of 4H—SiC along the x-axis and the y-axis at the varying rotation angle δ when the crystal orientation of FIG. 6 was used. The calculation in FIGS. 7(a) and 7(b) uses rotation angle δ=0° as the reference. In other words, the anisotropic mechanical properties described above are observed when δ is 0°. FIGS. 7(a) and 7(b) have the rotation angle δ as the axis of abscissa, and also show the directions of the x-axis and the y-axis which correspond to the rotation angle δ. When the rotation angle δ is 0°, the x-axis coincides with the <11-20> direction and the y-axis coincides with the <1-100> direction. When the rotation angle δ is 30°, the x-axis coincides with the <10-10> direction and the y-axis coincides with the <−1100> direction. When the rotation angle δ is 60°, the x-axis and the y-axis respectively coincide with adjacent directions equivalent to the direction of the x-axis and the direction of the y-axis that are observed when the rotation angle δ is 0°.

As shown in FIGS. 7(a) and 7(b), in a range where δ<15° is established, the linear expansion coefficient and Young's modulus of 4H—SiC are higher along the y-axis than along the x-axis, and are equal between the x-axis and the y-axis when δ is 15°. The linear expansion coefficient and the Young's modulus are conversely higher along the x-axis than along the y-axis in a range where 15°<δ<45° is established. When δ is 45°, the linear expansion coefficient and the Young's modulus are equal along the x-axis and along the y-axis, and in a range where 45°<δ<60° is satisfied, higher along the y-axis than along the x-axis. The same change is subsequently repeated in 60° cycles. The linear expansion coefficient and the Young's modulus along the x-axis that are observed when δ is 30° are equal to the physical property values along the y-axis that are observed when δ is 0°.

Thus, because 4H—SiC is hexagonal and has equivalent crystal orientations at 60° intervals, mechanical properties at δ=60° are equal to mechanical properties at δ=0°.

One of the <11-20> direction group and the <1-100> direction group coincides with the other when rotated by 30°. Considering the crystal orientation equivalence, the two direction groups can be expressed by two equivalent crystal orientations which are at an angle of 30° with each other. In other words, equivalent crystal orientations of the <11-20> direction group and the <1-100> direction group are spaced alternately at 30° intervals. Therefore, in the 60° cycles of the linear expansion coefficient and the Young's modulus, the linear expansion coefficient values and the Young's modulus values along the x-axis and the y-axis at δ=30° are respectively equal to those values along the y-axis and the x-axis at δ=0°. In short, the values along the x-axis and the values along the y-axis are switched at 30° intervals. It is deduced that a polytype (for example, 6H—SiC) of SiC which is another hexagonal semiconductor also exhibits the same tendency.

FIGS. 8(a) and 8(b) respectively show, as in FIGS. 7(a) and 7(b), the results of calculating the linear expansion coefficients and Young's moduli of Wurtzite (GaN) along the x-axis and the y-axis at the varying rotation angle δ. A value described in Non Patent Document No. 2 is used as the reference physical property value of GaN. The influence of the rotation angle over the linear expansion coefficient and Young's modulus of GaN tends to change the same way as in 4H—SiC, which is a hexagonal crystal semiconductor of the same crystal system.

It is concluded from these results that SiC and GaN which are hexagonal semiconductors have anisotropic mechanical properties in the <11-20> direction and in the <1-100> direction orthogonal to the <11-20> direction. However, the results show that mechanical property values are the same in the x-axis direction and the y-axis direction when an x-axis is set at an angle δ of ±15°, ±45°, ±75° . . . (subsequently changed at 30° intervals) with respect to the <11-20> direction and a y-axis is set so as to be orthogonal to the x-axis.

Accordingly, if the plurality of power semiconductor devices 10 are arranged on the semiconductor wafer 2 or 2' so that one of two sides determining the area of each power semiconductor device 10 is at an angle of 15° with the <11-20> direction as illustrated in FIGS. 1(a) and 1(b), the direction xc of one side of the cut out semiconductor chip 18 is at an angle α of 15° with the <11-20> direction. This makes mechanical properties such as the linear expansion coefficient and the Young's modulus equal in the direction xc and the direction yc which are parallel to two sides of the semiconductor chip 18. In other words, mechanical property values are equal along the two sides of the semiconductor chip 18, which makes the amount of heat deformation of the semiconductor chip itself equal along the x-axis and the y-axis. As a result, the concentration of strain and stress in one direction of the semiconductor chip is relieved. The concentration of stress is relieved also when the semiconductor chip is housed in a package because equal stress is applied from the package to the four corners of the semiconductor chip. Troubles such as a crack in the protective film 114 which protects the power semiconductor element 12 and a slide of a part of the wiring electrode 112 of the power semiconductor element 12 are consequently reduced. In addition, the defect ratio in a temperature cycle test is lowered and the reliability is improved.

The linear expansion coefficients and Young's moduli of SiC and GaN are considered to have temperature dependence. However, this hardly changes the angle δ at which the value along the x-axis and the value along the y axis are equal to each other. Therefore, no matter what temperature range the semiconductor chip 18 operates in, mechanical property values are equal along the two sides of the semiconductor chip 18 and the effects described above are obtained.

The angles that the two sides defining the rectangular area of an SiC or GaN semiconductor substrate form with the crystal orientation can be analyzed by, for example, X-ray diffraction. A simpler method is to identify from the direction of cleaving which is caused when a wafer is broken. In the case where it is known that the principal surface of the semiconductor substrate is the (0001) plane, the cleaving direction is the <11-20> direction. Once the directions of the two sides defining the rectangular area of the semiconductor substrate with respect to the crystal orientation are known, the linear expansion coefficients along the two sides defining the rectangular area can be obtained from FIG. 7 and FIG. 8, or by other methods.

As illustrated in FIGS. 7(a) and 7(b) and FIGS. 8(a) and 8(b), the difference in linear expansion coefficient and the difference in Young's modulus are small between the x-axis and the y-axis when the rotation angle δ is close to 15°, if not exactly 15°. As long as the rotation angle δ satisfies 10°≤δ≤20°, the difference in linear expansion coefficient and the difference in Young's modulus between the x-axis and the y-axis are generally within 5%, and the effects described above are obtained satisfactorily. If the rotation angle δ satisfies 12°≤δ≤18°, the difference in linear expansion coefficient and the difference in Young's modulus between the x-axis and the y-axis are generally within 2%.

The angle δ between one of the two sides defining the area of each power semiconductor device 10 and the <11-20> direction therefore preferably satisfies a relation 10°≤α≤20° and, more preferably, a relation 12°≤α≤18°. The angle α is most preferably 15°. The other of the two sides defining the area of the power semiconductor device 10 meanwhile satisfies a similar condition with regard to the <1-100> direction, which is orthogonal to the <11-20> direction.

The semiconductor wafer is thus designed so that the angle α between one of the two sides defining the area of the power semiconductor device 10 and the <11-20> direction or <1-100> direction of the hexagonal semiconductor is 15°. Herein, cases where "the angle α between one of the two sides defining the area of the power semiconductor device 10 and the <11-20> direction or <1-100> direction of the hexagonal semiconductor is 15°" include not only a case where this angle is exactly 15° but also a case where the angle satisfies a relation 14.5°≤α≤15.4°.

Figure 9:
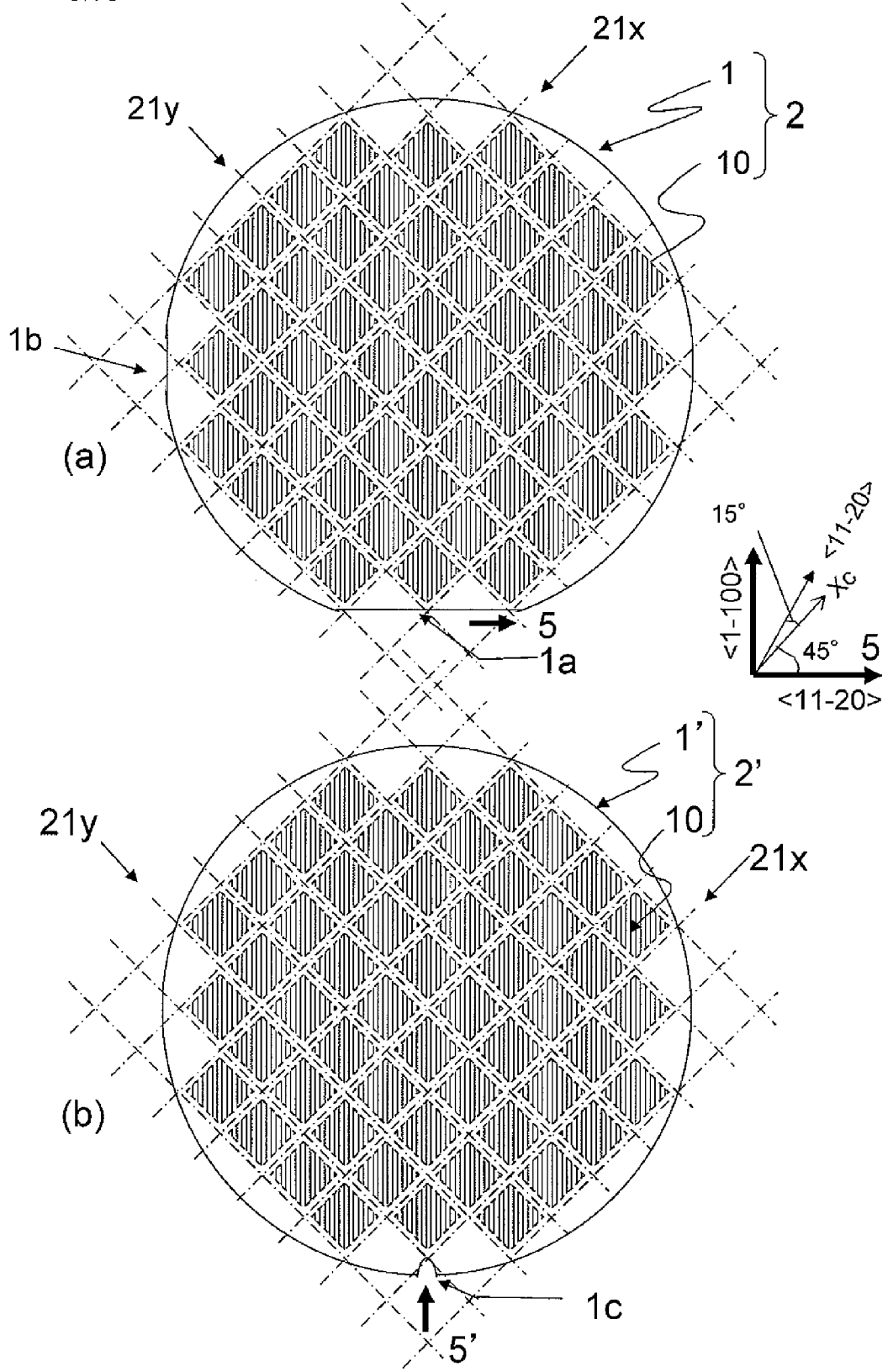
FIGS. 9(a) and 9(b) are each a plan view illustrating a semiconductor wafer according to another embodiment of the present invention.

As described above, a hexagonal semiconductor has equivalent crystal orientations at 60° intervals, and the relation of the two sides defining the power semiconductor device 10 with the <11-20> direction is therefore not limited to the one illustrated in FIGS. 1(a) and 1(b). For example, the power semiconductor devices 10 may be arranged in a manner illustrated in FIGS. 9(a) and 9(b). In FIG. 9(a), cutting lines 21x along which the power semiconductor devices 10 are separated from one another and the direction xc of one of two sides of each semiconductor chip are arranged at an angle of 45° with respect to the direction 5 of the orientation flat 1a. In FIG. 9(b), the direction xc of one of two sides of each semiconductor chip is at an angle of 45° with respect to the direction 5' of the notch 1c. The effects of the present invention can be obtained as described above also when the power semiconductor devices 10 are arranged on the semiconductor wafer 2 or 2' in the manner illustrated in FIGS. 9(a) and 9(b).

In these cases, the angle γ between one of the two sides defining the rectangle of each power semiconductor device 10 and the direction 5 of the orientation flat 1a satisfies a relation 40°≤γ≤50°. The angle γ more preferably satisfies a relation 42°≤γ≤48°, and is most preferably 45°.

The semiconductor wafer may be thus designed so that the angle γ between one of the two sides defining the rectangle and the direction 5 of the orientation flat 1a, or the direction 5' of the notch 1c, is 45°. Herein, cases where the angle γ between one of the two sides defining the rectangle and the direction of a mark for determining the crystal orientation is 45° " include a case where this angle is exactly 45° and a case where the angle satisfies a relation 44.5°≤γ≤45.4°.

In the semiconductor wafer 2 of FIGS. 9(a) and 9(b), where a direction reached by rotating from the direction 5 of the orientation flat 1a by 60° is the <11-20> direction again, it can be said that xc is at an angle of 15° with respect to the <11-20> direction. It can also be said that, when the semiconductor wafer 2 of FIG. 9(a) is divided along the cutting lines 21x and 21y, two sides of each semiconductor chip 18 are at an angle of 15° with respect to the <11-20> direction and the <1-100> direction as illustrated in FIG. 4(a). In FIG. 9(b), too, where the direction xc of one of the two sides of the semiconductor chip is at an angle of 45° with respect to the direction 5' of the notch 1c, it can be said that the two sides of the separated semiconductor chip 18 are at an angle of 15° with respect to the <11-20> direction and the <1-100> direction as illustrated in FIG. 4(a).

According to the semiconductor chip of this embodiment, the angle α between one of two sides defining the area of each power semiconductor device and the <11-20> direction or <1-100> direction of a hexagonal semiconductor that forms the wafer satisfies a relation 10°≤α≤20°. This makes the mechanical property values such as linear expansion coefficient and Young's modulus of the hexagonal semiconductor equal in the directions of the two orthogonal sides. The concentration of strain or stress in one direction of the semiconductor chip is therefore relieved. The concentration of stress is relieved also when the semiconductor chip is housed in a package because the substantially square shape of the semiconductor chip makes stress applied from the package to the four corners of the semiconductor chip equal to one another. Accordingly, even when there is a large temperature difference between the upper limit value and lower limit value of a use temperature range, a crack in a power semiconductor element or in an insulating thin film on the power semiconductor element, deformation of a wiring electrode, and the like are reduced and high reliability is accomplished. In the case where the hexagonal semiconductor is a silicon carbide semiconductor, in particular, a highly reliable semiconductor chip is realized which makes use of a feature of silicon carbide semiconductors in that silicon carbide semiconductors have excellent heat resistance.

According to the semiconductor wafer of this embodiment, a mark for determining the crystal orientation of the hexagonal semiconductor is provided in at least a part of the circumference of the wafer, and the direction determined by the mark is substantially parallel to the <11-20> direction or <1-100> direction of the hexagonal semiconductor. The angle γ between one of the two sides defining the rectangular area of each power semiconductor device and the direction determined by the mark satisfies 10°≤γ≤20° or 40°≤α≤50°. This way, the angle α between one of the two sides defining the rectangular area of the power semiconductor device and the <11-20> direction or <1-100> direction of the hexagonal semiconductor satisfies a relation 10°≤α≤20°. Mechanical property values such as linear expansion coefficient and Young's modulus of the hexagonal semiconductor are therefore substantially equal in the directions of the two orthogonal sides. Consequently, a semiconductor wafer from which the semiconductor chip described above can be cut out is realized.

Second Embodiment

A semiconductor chip manufacturing method according to an embodiment of the present invention is described.

A method of manufacturing the semiconductor wafers 2 and 2' is described first. In the semiconductor wafers 2 and 2' of FIGS. 1(a) and 1(b), one of two sides of each of the plurality of power semiconductor devices 10 formed on the wafers 1 and 1' is not parallel or perpendicular to the direction 5 of the orientation flat 1a or the direction 5' of the notch 1c, and is at an angle γ of 15° with the direction 5 of the orientation flat 1a, for example.

In order to form the power semiconductor devices 10 in this arrangement on the semiconductor wafer 2 or 2', the wafer 1 or 1' is rotated for exposure about an axis perpendicular to the principal surface by the angle γ, namely, 15°, from the conventional position in each photolithography step for manufacturing the power semiconductor devices 10. A normal exposure device has a function of adjusting the wafer position, with which a wafer can be rotated. Except for the wafer positioning (orienting) in photolithography steps, the same procedure as that of conventional power semiconductor devices can be used to manufacture the semiconductor wafer 2 or 2'.

A semiconductor chip manufacturing method in which the semiconductor wafer 2 or 2' is broken into pieces to obtain the semiconductor chip 18 is described next.

The power semiconductor devices 10 formed on the semiconductor wafer 2 or 2' each have a square shape on the principal surface. As illustrated in FIG. 1(a), a direction that is at an angle of 15° with the <11-20> direction, for example, is called a first direction and a direction perpendicular to the first direction is called a second direction. The first direction and the second direction are parallel to the cutting lines 20x and 20y, respectively. The power semiconductor devices 10 are arranged at equal pitches c in the first direction and the second direction. The pitch c is, for example, 3.7 mm.

The "first direction" is designed so as to be at an angle of 15° with the <11-20> direction or <1-100> direction of the hexagonal semiconductor. The "first direction" herein includes a direction whose angle is exactly 15° and a direction whose angle is equal to or more than 14.5° and equal to or less than 15.4°.

In the case of the semiconductor wafer 2 or 2' of FIG. 1(a) or 1(b), an angle between the direction of the orientation flat 1a and the first direction is 15°, and an angle between the direction 5' of the notch 1c and the second direction is 15°. The first direction or the second direction is determined by selecting a direction that is at 15° relative to directions indicated by these marks. As in the definition of the first direction given above, the "second direction" includes a direction whose angle is exactly 15° and a direction whose angle is equal to or more than 14.5° and equal to or less than 15.4°.

The first direction and the second direction do not coincide with the cleaving direction of a hexagonal semiconductor that forms the semiconductor wafer 2 or 2'. A wafer dividing device such as a dicing saw or a laser dicing device is therefore used to cut the semiconductor wafer 2 or 2'.

Specifically, the semiconductor wafer 2 or 2' is first divided a plurality of times in a direction parallel to the second direction, which is at an angle of 90° with the first direction, while moving the semiconductor wafer 2 or 2' relative to a dividing position of the wafer dividing device for a distance c at a time in the first direction, which is determined in the manner described above. Strips of the semiconductor wafer each having a width c and having the plurality of power semiconductor devices 10 aligned in the second direction are thus cut out.

The strips of the semiconductor wafer obtained by the division are next rotated by 90° relative to the wafer dividing device. Thereafter, the strips of the semiconductor wafer obtained by the division are divided a plurality of times in parallel to the first direction, while moving the strips of the semiconductor wafer relative to the dividing position of the wafer dividing device for the distance c at a time in the second direction. Square semiconductor chips that measure c in length along each side are thus separated from one another.

In the procedure described above, the semiconductor wafer 2 or 2' is divided first along the cutting lines 20y. The semiconductor wafer 2 or 2' may instead be divided first along the cutting lines 20x. In this case, a direction that is at an angle of 15° with the <1-100> direction is called a first direction, and a direction perpendicular to the first direction is called a second direction. When the directions are defined this way, the semiconductor wafer 2 or 2' is divided a plurality of times in parallel to the second direction while moving the semiconductor wafer 2 or 2' relative to the dividing position of the wafer dividing device for the distance c at a time in the first direction as in the above description. Thereafter, strips of the semiconductor wafer 2 or 2' obtained by the division are divided a plurality of times in parallel to the first direction while moving the strips of the semiconductor wafer or 2' relative to the dividing position of the wafer dividing device for the distance c at a time in the second direction.

According to the semiconductor chip manufacturing method of this embodiment, a semiconductor wafer made from a hexagonal semiconductor is divided a plurality of times in parallel to the second direction, which is at an angle of 90° with the first direction, while moving the semiconductor wafer relative to the dividing position of the wafer dividing device for the distance c at a time in the first direction, which is at an angle of 15° with the <11-20> direction of the hexagonal semiconductor. Strips of the semiconductor wafer obtained by the division are divided a plurality of times in parallel to the first direction, while moving the strips of the semiconductor wafer relative to the dividing position of the wafer dividing device for the distance c at a time in the second direction. A semiconductor chip that has a structure described in the first embodiment is thus manufactured.

Third Embodiment

A semiconductor wafer according to another embodiment of the present invention is described. FIGS. 10(a) and 10(b) are each a plan view illustrating a semiconductor wafer according to another embodiment of the present invention, and each shows the principal surface of the semiconductor wafer. A semiconductor wafer 52 illustrated in FIG. 10(a) and a semiconductor wafer 52' illustrated in FIG. 10(b) respectively include a wafer 51 and a wafer 51' which are made from a hexagonal semiconductor as in the first embodiment.

As illustrated in FIG. 10(a), the semiconductor wafer 52 has an orientation flat 51a and a second orientation flat 51b which are provided in the circumference of the wafer 51. The second orientation flat 51b may be omitted. As illustrated in FIG. 10(b), the semiconductor wafer 52' has a notch 51c which is provided in the circumference of the wafer 51'.

As illustrated in FIG. 10(a), the wafer 51 of this embodiment differs from the first embodiment in that a direction 55 of the orientation flat 51a and a <11-20> direction which is a crystal orientation of a hexagonal semiconductor that forms the wafer 51 are not parallel to each other. Instead, an angle β' between these two directions satisfies a relation $10° \leq β' \leq 20°$. The angle β' more preferably satisfies a relation $12° \leq β' \leq 18°$, and is most preferably 15°.

The semiconductor wafer 52 includes the wafer 51, which is provided with the marks for determining the crystal orientation described above, and the plurality of power semiconductor devices 10, which are formed on the wafer 51. The semiconductor wafer 52, which is obtained by providing the plurality of power semiconductor devices 10 on the above-mentioned wafer 51, too, satisfies the relation between the mark for determining the crystal orientation and the crystal orientation of the hexagonal semiconductor as described above. Each of the plurality of power semiconductor devices 10 has an area defined by a rectangle on the principal surface of the semiconductor wafer 52 as indicated by hatching. The angle β' between one of two sides defining the rectangle and the direction 55 of the orientation flat 51a is zero. In other words, one of the two sides is parallel to the direction 55 of the orientation flat 51a.

As illustrated in FIG. 10(b), the semiconductor wafer 52', too, includes the wafer 51', which is provided with the mark for determining the crystal orientation described above, and a plurality of power semiconductor devices 10, which is formed on the wafer 51'. The semiconductor wafer 52', which is obtained by providing a plurality of power semiconductor devices on the above-mentioned wafer 51', too, satisfies the relation between a mark for determining the crystal orientation and the crystal orientation of the hexagonal semiconductor as described above. Each of the plurality of power semiconductor devices 10 has an area defined by a rectangle on the principal surface of the semiconductor wafer 52' as indicated by hatching. The angle β' between one of two sides defining the rectangle and a direction 55' of the notch 51c is zero. In other words, one of the two sides is parallel to the direction 55' of the notch 51c.

In the actual wafers 51 and 51', however, the angle β' between the direction 55 of the orientation flat 51a and the <11-20> direction, or the angle β' between the direction 55' of the notch 51c and the <1-100> direction, may deviate from a design value by about ±5° due to manufacturing error. It is therefore sufficient if an angle γ' that one of the two sides defining the rectangular area of each power semiconductor device 10 forms with the direction 55 of the orientation flat 51a, or with the direction 55' of the notch 51c, satisfies a relation $-5° \leq \gamma' \leq 5°$.

The semiconductor wafers 52 and 52' thus have areas each defined by a rectangle one side of which is parallel to the direction 55 of the orientation flat 51a or the direction 55' of the notch 51c. The angle β' between the direction 55 of the orientation flat 51a or the direction 55' of the notch 51c and the <11-20> direction satisfies $10° \leq \beta' \leq 20°$. Therefore, when angles that the two sides defining the rectangular area of each power semiconductor device 10 form with the <11-20> direction and the <1-100> direction are defined as α, the angles α satisfy a relation $10° \leq \alpha \leq 20°$ as illustrated in FIG. 4(a). The angles α preferably satisfy a relation $12° \leq \alpha \leq 18°$, and are most preferably 15°.

Therefore, as described in detail in the first embodiment, mechanical property values such as the linear expansion coefficient and Young's modulus of the hexagonal semiconductor are substantially equal in the directions of the two sides defining the areas of the semiconductor devices 10 which are obtained by dividing the semiconductor wafer 52 or 52' of this embodiment. When the semiconductor wafer 52 or 52' is divided, this relieves the concentration of strain and stress in one direction of a semiconductor chip. The concentration of stress is relieved also when the semiconductor chip is housed in a package because the substantially square shape of the semiconductor chip makes stress applied from the package to the four corners of the semiconductor chip equal to one another. Accordingly, even when there is a large temperature difference between the upper limit value and lower limit value of a use temperature range, a crack in a power semiconductor element or in an insulating thin film on the power semiconductor element, deformation of a wiring electrode, and the like are reduced and high reliability is accomplished. In the case where the hexagonal semiconductor is a silicon carbide semiconductor, in particular, a highly reliable semiconductor chip is realized which makes use of a feature of silicon carbide semiconductors in that silicon carbide semiconductors have excellent heat resistance.

According to the wafer of this embodiment, an orientation flat or a notch is provided in the wafer so that the direction of the orientation flat, or the direction of the notch, satisfies $10° \leq \beta' \leq 20°$ with respect to the <11-20> direction or the <1-100> direction, which is a crystal orientation of a hexagonal semiconductor that forms the wafer. A semiconductor wafer capable of providing the effects described above is therefore obtained by forming a power semiconductor device on the wafer so that one of the two sides defining the area of the power semiconductor device is parallel to the direction of the orientation flat or to the direction of the notch.

Fourth Embodiment

A method of manufacturing a semiconductor chip from the semiconductor wafer of the third embodiment is described below.

Figure 10:
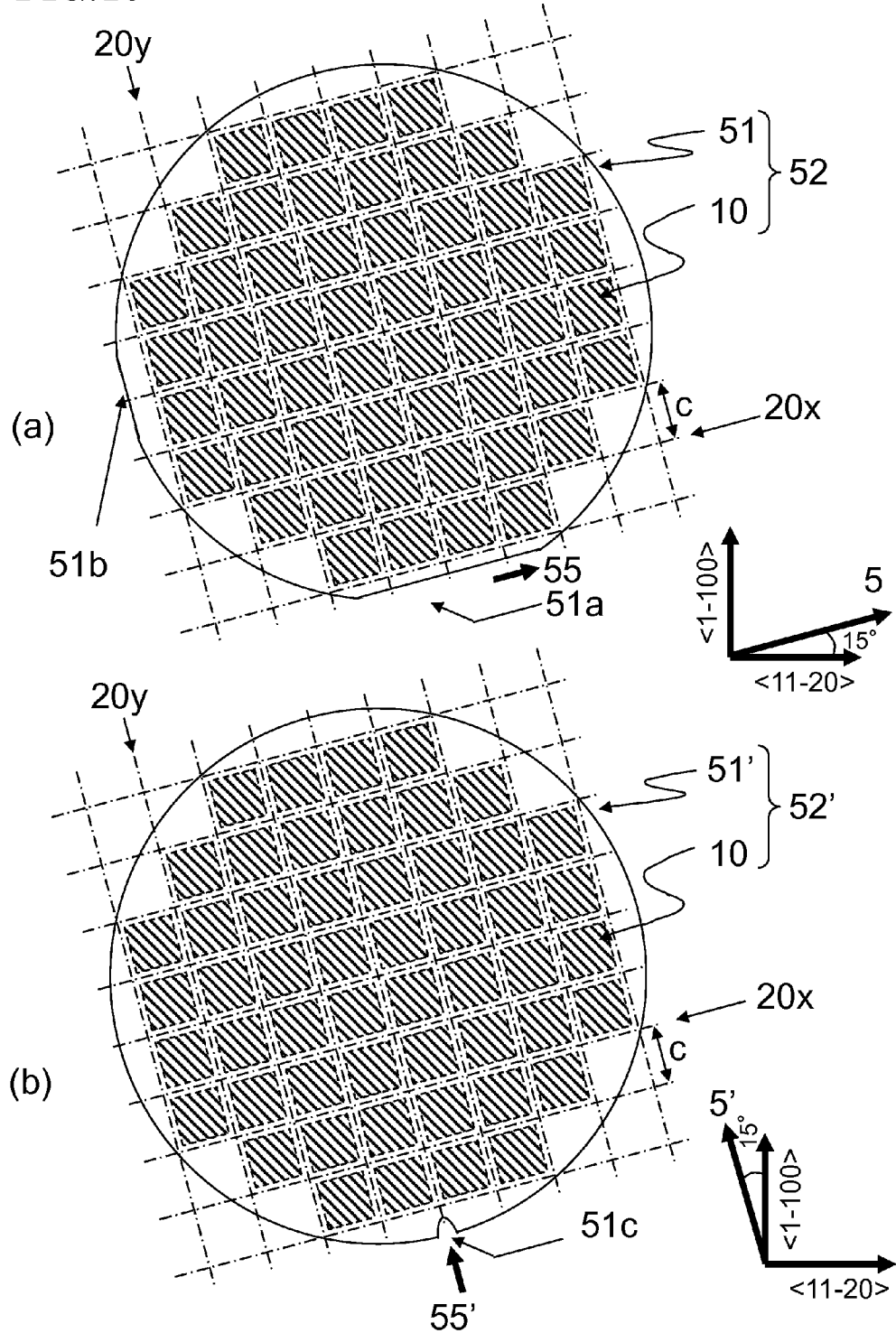
FIGS. 10(a) and 10(b) are each a plan view illustrating a semiconductor wafer according to a third embodiment of the present invention.

The wafers 51 and 51' of FIG. 10 are manufactured first. The orientation flat 51a or the notch 51c is formed in an ingot of the hexagonal semiconductor so that the angle β' between the <11-20> direction or the <1-100> direction, which is a crystal orientation of the hexagonal semiconductor, and the direction 55 of the orientation flat 51a or the direction 55' of the notch 51c satisfies $10° \leq \beta' \leq 20°$. Thereafter, the ingot of the hexagonal semiconductor is sliced into slices of a given thickness to obtain a thin sheet-shaped hexagonal semiconductor. Two principal surfaces of the thin sheet-shaped hexagonal semiconductor are polished until at least one of the principal surfaces is finished as a mirrored surface, to thereby obtain the wafers 51 and 51' of FIGS. 10(a) and 10(b). In the wafers 51 and 51', the angle β' between the direction 55 of the orientation flat 51a or the direction 55' of the notch 51c and the <11-20> direction or the <1-100> direction of the hexagonal semiconductor satisfies $10° \leq \beta' \leq 20°$.

Next, the wafers 51 and 51' are used to manufacture the semiconductor wafers 52 and 52'. In the wafers 51 and 51', the direction 55 of the orientation flat 51a or the direction 55' of the notch 51c is not parallel to the <11-20> direction or the <1-100> direction, and instead forms the angle β' which satisfies $10° \leq \beta' \leq 20°$ with the <11-20> direction or the <1-100> direction. Therefore, as described in the first embodiment, forming each power semiconductor device 10 on the wafer 51 or 51' such that the direction 55 of the orientation flat 51a or the direction 55' of the notch 51c is parallel to one of the two sides defining the area of the power semiconductor device 10 makes mechanical property values such as the linear expansion coefficient and Young's modulus of the hexagonal semiconductor substantially equal in the directions of the two orthogonal sides.

This arrangement of the power semiconductor devices 10 on the wafer 51 or 51' is the same as the arrangement in conventional semiconductor wafers illustrated in FIGS. 18(a) and 18(b) from the viewpoint of the relation of the two sides defining each power semiconductor device 10 with the direction of the orientation flat or the direction of the notch. The same semiconductor manufacturing process as in conventional technology can therefore be used to manufacture the semiconductor wafers 52 and 52' from the wafers 51 and 51'.

A semiconductor chip manufacturing method in which the semiconductor wafer 52 or 52' is broken into pieces to obtain the semiconductor chip 18 is described next.

The power semiconductor devices 10 formed on the semiconductor wafer 52 or 52' each have a square shape on the principal surface. As illustrated in FIG. 10(a), a direction whose angle γ' with respect to the direction 55 of the orientation flat 51a is equal to or more than −5° and equal to or less than 5° is called a first direction, and a direction perpendicular to the first direction is called a second direction. In the case of the semiconductor wafer 52' provided with the notch 51c as illustrated in FIG. 10(b), a direction whose angle γ' with respect to the direction 55' of the notch 51c is equal to or more than 85° and equal to or less than 95° is called a first direction, and a direction perpendicular to the first direction is called a second direction. The first direction and the second direction are parallel to the cutting lines 20x and the cutting lines 20y, respectively. The power semiconductor devices 10 are arranged at equal pitches c in the first direction and the second direction. The pitch c is, for example, 3.7 mm.

The first direction and the second direction do not coincide with the cleaving direction of a hexagonal semiconductor that forms the semiconductor wafer 52 or 52'. A wafer dividing device such as a dicing saw or a laser dicing device is therefore used to cut the semiconductor wafer 52 or 52'.

Specifically, the semiconductor wafer 52 or 52' is first divided a plurality of times in a direction parallel to the second direction, which is at an angle of 90° with the first direction, while moving the semiconductor wafer 52 or 52' relative to a dividing position of the wafer dividing device for a distance c at a time in the first direction, which is determined in the manner described above. Strips of the semiconductor wafer each having a width c and having the plurality of power semiconductor devices 10 aligned in the second direction are thus cut out.

The strips of the semiconductor wafer obtained by the division are next rotated by 90° relative to the wafer dividing device. Thereafter, the strips of the semiconductor wafer obtained by the division are divided a plurality of times in parallel to the first direction, while moving the strips of the semiconductor wafer relative to the dividing position of the wafer dividing device for the distance c at a time in the second direction. Square semiconductor chips that measure c in length along each side are thus separated from one another.

In the procedure described above, the semiconductor wafer 52 or 52' is divided first along the cutting lines 20y. The semiconductor wafer 52 or 52' may instead be divided first along the cutting lines 20x. In this case, a direction whose angle γ' with respect to the direction 55 of the orientation flat 51a is equal to or more than 85° and equal to or less than 95° is called a first direction, and a direction perpendicular to the first direction is called a second direction. Alternatively, a direction whose angle γ' with respect to the direction 55' of the notch 51c is equal to or more than −5° and equal to or less than 5° is called a first direction, and a direction perpendicular to the first direction is called a second direction. When the directions are defined this way, the semiconductor wafer 52 or 52' is divided a plurality of times in parallel to the second direction while moving the semiconductor wafer 52 or 52' relative to the dividing position of the wafer dividing device for the distance c at a time in the first direction as in the above description. Thereafter, strips of the semiconductor wafer 52 or 52' obtained by the division are divided a plurality of times in parallel to the first direction while moving the strips of the semiconductor wafer 52 or 52' relative to the dividing position of the wafer dividing device for the distance c at a time in the second direction.

According to the semiconductor chip manufacturing method of this embodiment, a semiconductor wafer made from a hexagonal semiconductor is divided a plurality of times in parallel to a second direction, which is at an angle of 90° with a first direction, while moving the semiconductor wafer relative to the dividing position of a wafer dividing device for the distance c at a time in the first direction, which is at an angle equal to or more than −5° and equal to or less than 5° or equal to or more than 85° and equal to or less than 95° with respect to a mark for determining the crystal direction of the hexagonal semiconductor. Strips of the semiconductor wafer obtained by the division are divided a plurality of times in parallel to the first direction, while moving the strips of the semiconductor wafer relative to the dividing position of the wafer dividing device for the distance c at a time in the second direction. A semiconductor chip that has a structure described in the third embodiment is thus manufactured.

EXAMPLE

Concrete structures of each power semiconductor device 10 are described below.

An Example in which the power semiconductor device 10 is a MISFET is described first. The power semiconductor device 10 of this Example is a vertical MISFET that uses silicon carbide (4H—SiC). The power semiconductor device 10 of this Example is constituted of a unit cell which includes a silicon carbide layer, a source electrode and a drain electrode electrically connected to the silicon carbide layer, and a gate electrode used to switch a power semiconductor element on and off. Typically, the power semiconductor device 10 has a structure in which a plurality of unit cells are arranged.

FIG. 11(a) is a schematic sectional view of a unit cell in this Example, and illustrates two adjacent unit cells. FIG. 11(b) is a plan view illustrating a state where a plurality of unit cells are arranged.

In the example of FIG. 11, each unit cell 100 has a substantially oblong (or square) shape in plan view on a plane parallel to the principal surface of a semiconductor wafer. The unit cells 100 are arranged two-dimensionally in a direction x and a direction y, which is perpendicular to the direction x. Each unit cell 100 may have, for example, a stripe shape stretching in one direction (e.g., the direction y) in plan view as illustrated in FIG. 11(c). In FIG. 11(b), unit cell repetition units in the direction x and the direction y (the lengths of each unit cell along the direction x and the direction y) are denoted by Px and Py. Unit cell repetition units in the direction x and the direction y in FIG. 11(c) are denoted by Qx and Qy. The units Px, Py, and Qx are 5 to 20 μm, preferably 8 to 15 μm. The unit Qy is greater than Px, Py, and Qx, and is equal to or more than 20 μm. At maximum, Qy has a length equivalent to one side (e.g., 5 mm) of the chip size of a power semiconductor element which is formed from an aggregation of unit cells.

Each unit cell 100 includes a substrate 101, a silicon carbide layer 102, which is formed on a surface of the substrate 101, a source electrode 109, which is electrically connected to the silicon carbide layer 102, a gate electrode 108, which at least partially covers the silicon carbide layer 102, and a drain electrode 110, which is electrically connected to the rear surface of the substrate 101. A channel layer 106 and a gate insulating film 107 are formed in the order stated between the silicon carbide layer 102 and the gate electrode 108.

The substrate 101 is an n-type semiconductor substrate (wafer) made from silicon carbide which is a hexagonal semiconductor wafer. The substrate 101 is made from, for example, 4H—SiC, and is an off-cut substrate with a surface increased in step density by a tilt from the (0001) Si face by several degrees (off-angle)

The silicon carbide layer 102 is a silicon carbide epitaxial layer formed on the substrate 101. The silicon carbide layer 102 has a p-type well region 103, which is formed for each unit cell and is spaced apart from adjacent unit cells, and an n-type drift region 102d, which is a part of the silicon carbide layer 102 where the p-type well region 103 is not formed. The drift region 102d includes a JFET region 102j, which is located between the well regions 103 of adjacent unit cells. The drift region 102d is, for example, an n⁻-type silicon carbide layer that contains an n-type impurity at a concentration lower than in the substrate 101. Formed inside the p-type well region 103 are an n⁺-type source region 104, which contains an n-type impurity at a high concentration, and a p⁺-type contact region 105, which is electrically connected to the p-type well region 103 and contains a p-type impurity at a concentration higher than in the p-type well region 103. The p-type well region 103 in this Example is formed so as to surround the n+-type source region 104.

The source electrode 109 is in ohmic contact with the n+-type source region 104 and the p+-type contact region 105. In this embodiment, side walls of the source electrode 109 are in contact with the n+-type source region 104. The bottom (lower end) of the source electrode 109 is in contact with the p+-type contact region 105 and the n+-type source region 104.

The channel layer 106 is, for example, an n-type epitaxial layer made from 4H—SiC, and is provided so as to connect adjacent p-type well regions 103 and to be in contact with the n+-type source region 104.

The gate insulating film 107 is provided on a surface of the channel layer 106. The gate insulating film 107 here is, for example, a thermally oxidized film that is obtained by thermally oxidizing the channel layer 106. Needless to say, the gate insulating film 107 may instead be an oxide film formed by deposition such as CVD, or other insulating films such as a silicon nitride film and a silicon oxynitride film.

The source electrode 109 in one unit cell and the source electrode 109 in another unit cell are connected in parallel to each other by the wiring electrode 112. The source electrode 109 is connected to the wiring electrode 112 in a contact hole 111c. The wiring electrode 112 and the gate electrode 108 are electrically isolated from each other by an interlayer insulating film 111. The drain electrode 110 formed on the rear surface of the substrate 101 is in ohmic contact with the substrate 101. A rear wiring electrode 113 is provided on the drain electrode 110.

The unit cells 100 are arranged two-dimensionally as illustrated in FIGS. 11(b) and 11(c), thereby constituting the power semiconductor element 12 (FIG. 4) of the power semiconductor device 10. A surface of the power semiconductor element 12 is partially (mainly the perimeter) covered with the protective film 114 which is made from, for example, silicon nitride.

Figure 12:
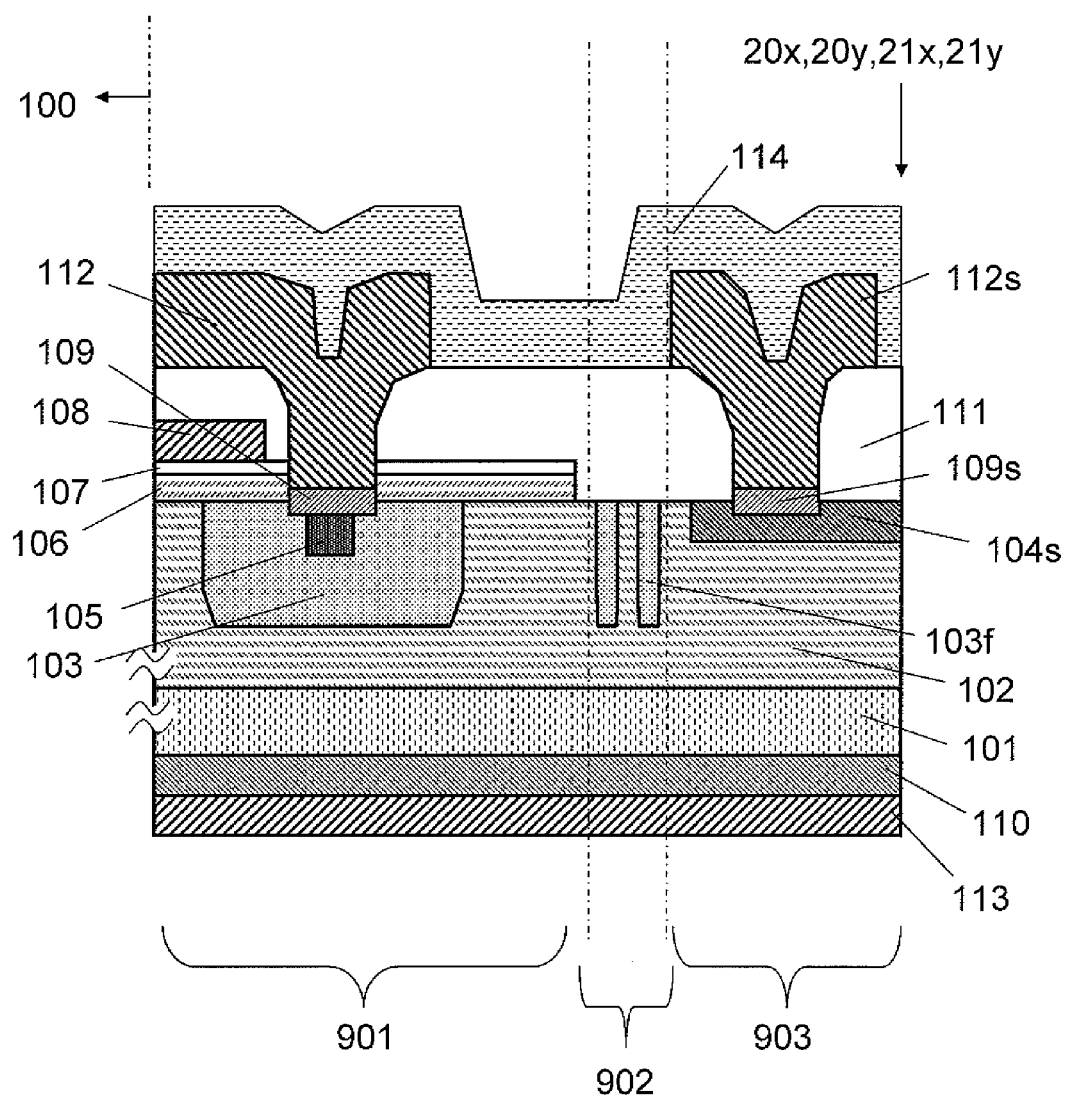
FIG. 12 is a schematic sectional view illustrating the structure of a perimeter portion of the MISFET of FIG. 11.

The power semiconductor device 10 may include a wiring pad and a perimeter structure if necessary. FIG. 12 illustrates a more concrete perimeter structure. The perimeter structure is formed from the same components as those of the unit cell 100 in many cases. The same components are denoted here by the same numerals. A region 103f has the same p-type conductivity as that of a p well region 103. A region 902 has an FLR structure in which an element portion 901 is covered with a plurality of ring-shaped structures. The element portion 901 has a diode structure, and the p well region 103 and a drift layer 102 constitute a p-n junction. The p well region 103 is connected to the wiring electrode 112 via the p+-type contact region 105 and the source electrode 109. A region 903 includes a floating electrode 109s, which is not connected to a source electrode, and includes an n+-type conductivity region 104s, which has the same conductivity type as the source region 104. The n+-type conductivity region 104s is electrically connected to a wiring electrode 112s for a floating electrode via the floating electrode 109s. This region 903 is called herein as, for example, a channel stopper region. The form of this perimeter portion is not limited to that of FIG. 12, and is selected to suit the selected form and features of the element portion of the power semiconductor element. In FIG. 12, the left edge of the perimeter structure is connected to the unit cell 100, and the cutting lines 20x, 20y, 21x, and 21y are to the right of the perimeter structure.

Figure 13:
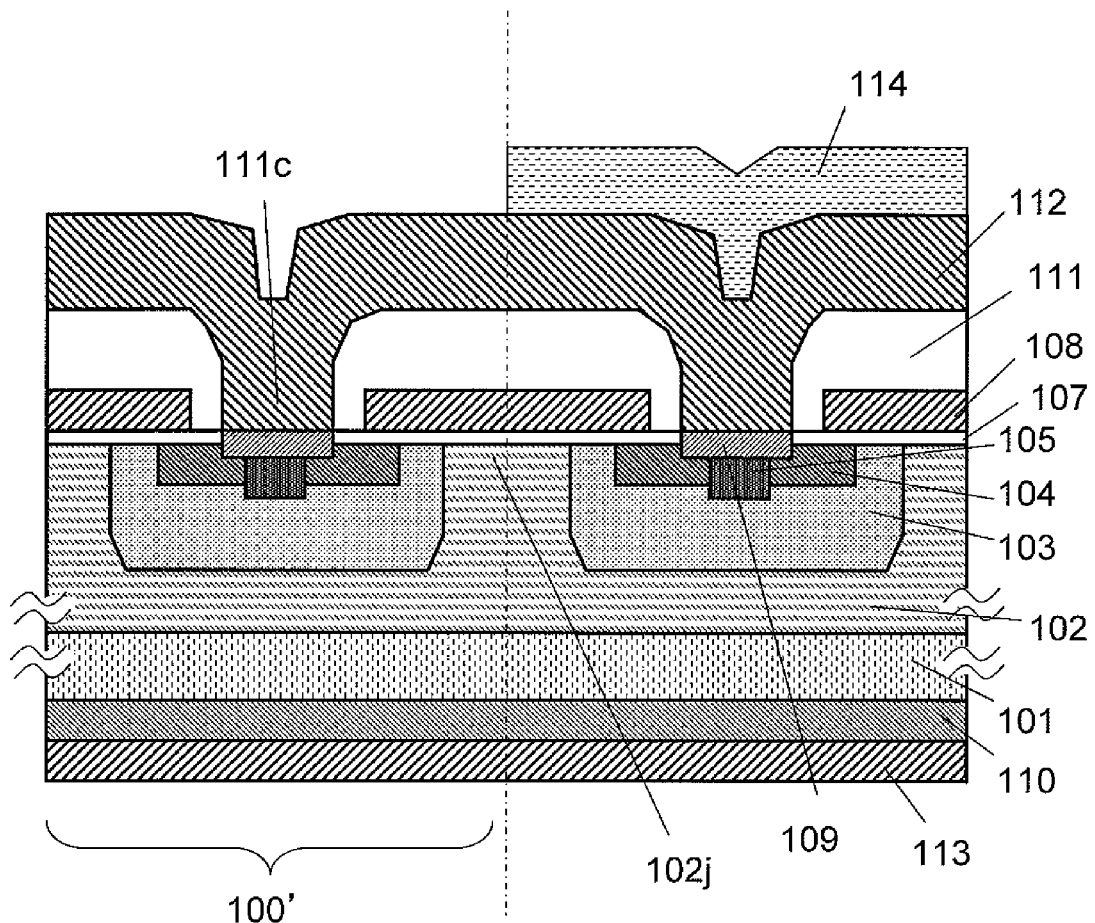
FIG. 13 is a schematic sectional view illustrating the structure of a double implantation MISFET without a channel layer which is another example of the semiconductor chip according to the present invention.

FIG. 13 is a modification example of the MISFET illustrated in FIG. 11. FIG. 13 differs from FIG. 11 in that the channel layer 106 is not provided, and a plurality of unit cells 100' without a channel layer is formed to constitute the power semiconductor element 12.

FIG. 14 illustrates a unit cell 100a of a trench MISFET with the channel layer 106, and FIG. 15 illustrates a unit cell 100b of a trench MISFET without the channel layer 106. The semiconductor substrate 101 is one of SiC and GaN which are hexagonal semiconductors. A drift layer 102d is formed by homoepitaxial growth.

In FIGS. 14 and 15, a trench 102t pierces the source region 104 and the well region 103 to reach the drift region 102d. The trench MISFET is formed by forming the channel layer 106, the gate insulating film 107, and the gate electrode 108 so as to cover the side walls of the trench 102t.

The power semiconductor devices 10 of the present invention are not limited to MISFETs, and can be other well-known power semiconductor devices such as insulated gate bipolar transistors (IGBTs), MESFETS, and JFETs.

Figure 16:
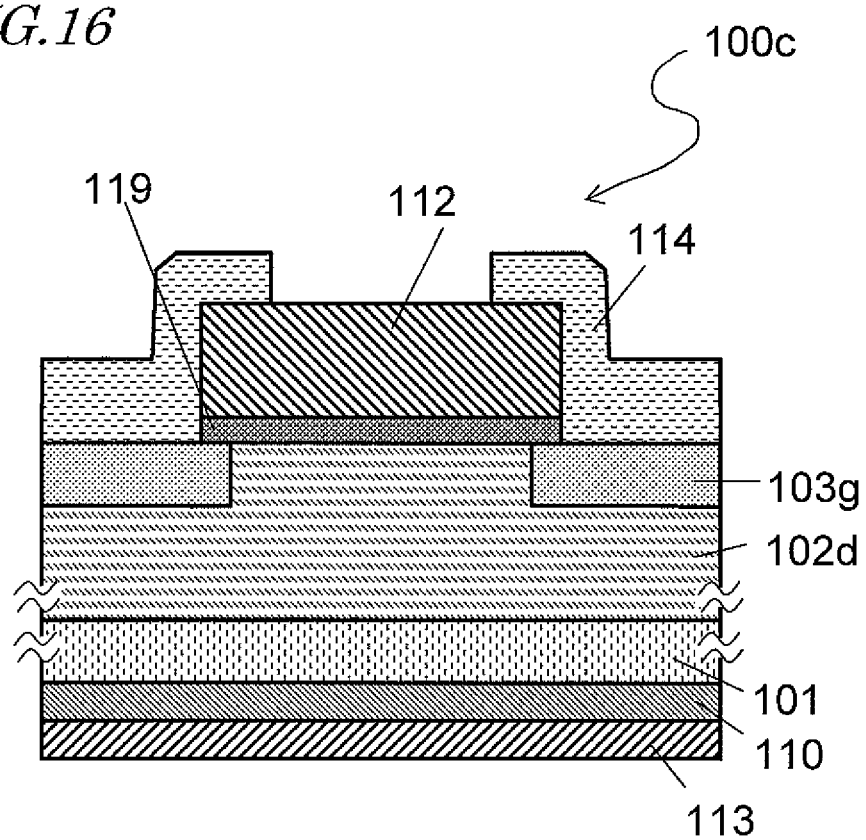
FIG. 16 is a schematic sectional view illustrating the structure of a Schottky barrier diode which is yet still another example of the semiconductor chip according to the present invention.
Figure 17:
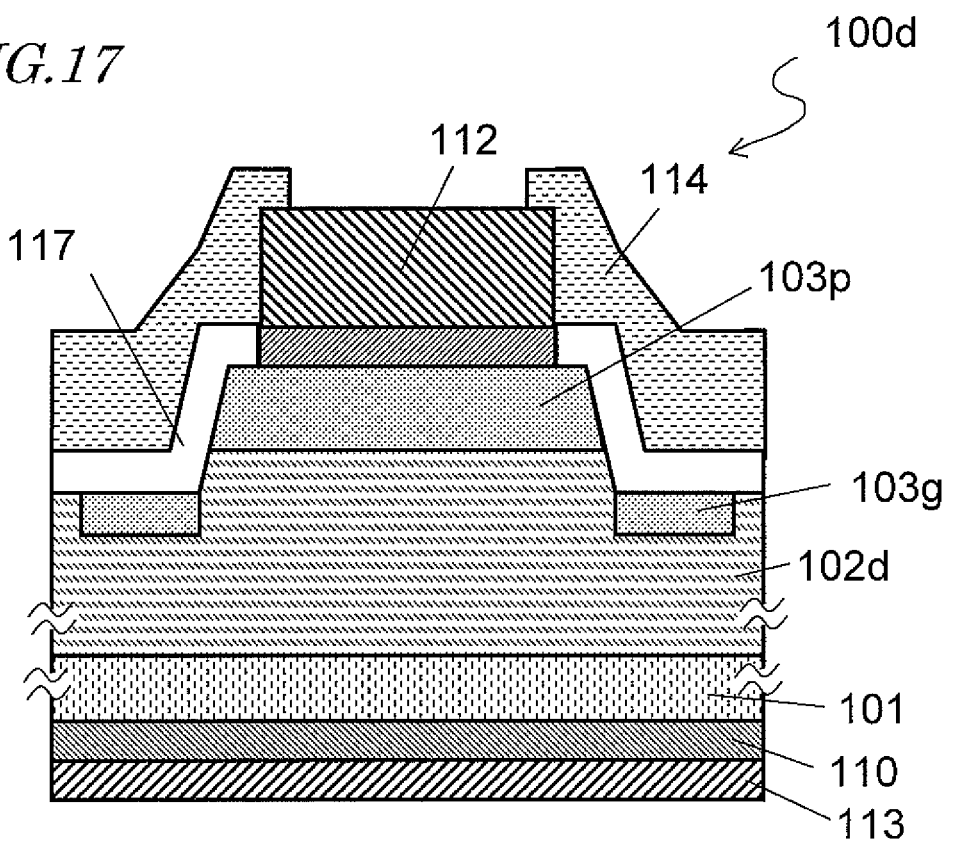
FIG. 17 is a schematic sectional view illustrating the structure of a p-n junction diode which is yet still another example of the semiconductor chip according to the present invention.

The power semiconductor devices 10 may also be diodes. For example, FIG. 16 illustrates a Schottky barrier diode and FIG. 17 illustrates a p-n junction diode. The semiconductor substrate 101 is one of SiC and GaN which are hexagonal semiconductors. The drift layer 102d is formed by homoepitaxial growth on the semiconductor substrate 101. The drain electrode 110 and the rear wiring electrode 113 are provided on a side of the semiconductor substrate 101 where the drift layer 102d is not provided.

As illustrated in FIG. 16, the drift layer 102d is provided with a p-type region or high-resistance region 103g which functions as a guard ring region. A Schottky electrode 119 is provided so as to be in contact with the drift region 102d, thereby forming a Schottky junction. The Schottky electrode 119 partially overlaps with a guard ring region 103g. The wiring electrode 112 is provided on the Schottky electrode 119. A Schottky barrier diode 100c corresponds to the power semiconductor element 12 of FIG. 4(b). The power semiconductor element 12 may include a plurality of Schottky barrier diodes 100c. The perimeter portion 16 may be omitted.

As illustrated in FIG. 17, a p-n junction diode 100d has, for example, a mesa structure. The p-type guard ring region 103g is provided in the drift layer 102d at the bottom of the mesa structure. A p-type region 103p is formed on the drift layer 102d. The p-type region 103p and the n-type drift region 102d form a p-n junction and determine the withstand voltage structure of the p-n junction diode 100d. End faces of the mesa structure on both sides of the p-n junction are covered with a protective film 117. The protective film 117 is formed from an insulator such as silicon oxide or silicon nitride. In the case where the p-type region 103p and the drift region 102d are SiC, a thermally oxidized film obtained by thermally oxidizing a part of the SiC regions may be selected as the protective film 117.

INDUSTRIAL APPLICABILITY

The present invention is widely applicable to power semiconductor devices formed on a wafer that is made from a hexagonal semiconductor.

REFERENCE SIGNS LIST 1, 1', 51, 51' wafer
1a, 51a orientation flat
1b, 51b second orientation flat
1c, 51c notch
2, 2', 52, 52' semiconductor wafer
10 power semiconductor device
12 power semiconductor element
16 perimeter portion
18 semiconductor chip 20x, 20y, 21x, 21y cutting line
100, 100', 100a, 100b MISFET (unit cell)
100c Schottky barrier diode
100d p-n junction diode
112 wiring electrode
114 protective film

The invention claimed is:

1. A semiconductor chip on which a power semiconductor device is formed and which comprises a semiconductor substrate made from a hexagonal semiconductor having an anisotropic property in linear expansion coefficient due to a crystal orientation,
   wherein the semiconductor substrate has a shape of a rectangle on a principal surface,
   wherein the rectangle is defined by two sides having lengths a and b equal to each other,
   wherein linear expansion coefficients in directions parallel to the two sides of the semiconductor substrate are equal to each other, and
   wherein the principal surface of the semiconductor substrate and a (0001) plane or (000-1) plane of the hexagonal semiconductor form an angle θ, which satisfies the following expression $-10° \leq \theta \leq 10°$.

2. A semiconductor chip on which a power semiconductor device is formed and which comprises a semiconductor substrate made from a hexagonal semiconductor,
   wherein the semiconductor substrate has a shape of a rectangle on a principal surface,
   wherein the rectangle is defined by two sides having lengths a and b equal to each other, and
   wherein one of the two sides and a <11-20> direction of the hexagonal semiconductor form an angle of 15°, and another of the two sides and a <1-100> direction of the hexagonal semiconductor form an angle of 15°.

3. The semiconductor chip according to claim 2, wherein the power semiconductor device comprises:
   a power semiconductor element formed on the semiconductor substrate; and
   a protective film which is provided on the semiconductor substrate so as to cover the power semiconductor element at least partially, and which has an isotropic mechanical property.

4. The semiconductor chip according to claim 3, wherein the power semiconductor element is formed on the principal surface of the semiconductor substrate, and comprises an epitaxial layer made from a same material as the semiconductor substrate.

5. The semiconductor chip according to claim 3, wherein the protective film contains at least one of silicon nitride and silicon oxide.

6. The semiconductor chip according to claim 3, wherein the power semiconductor element comprises a wiring electrode that has an isotropic mechanical property.

7. The semiconductor chip according to claim 6, wherein the wiring electrode is made from aluminum, copper, or an alloy that contains at least one of aluminum and copper.

8. The semiconductor chip according to claim 2, wherein the principal surface of the semiconductor substrate and a (0001) plane or (000-1) plane of the hexagonal semiconductor form an angle θ, which satisfies the following expression $-10° \leq \theta \leq 10°$.

9. The semiconductor chip according to claim 2, wherein the semiconductor substrate is a silicon carbide semiconductor substrate.

10. The semiconductor chip according to claim 2, wherein the semiconductor substrate is a gallium nitride semiconductor substrate.

11. The semiconductor chip according to claim 3, wherein the power semiconductor element is one selected from the group consisting of a metal-insulator-semiconductor field effect transistor, a p-n junction diode, and a Schottky barrier diode.

12. The semiconductor chip according to claim 3, wherein the power semiconductor element is a switching element or a rectifier element.

13. A semiconductor wafer, comprising:
    a wafer made from a hexagonal semiconductor; and
    a plurality of power semiconductor devices formed on the wafer,
    wherein the wafer has an anisotropic mechanical property due to crystal orientation on a plane parallel to a principal surface,
    wherein the wafer is provided with a mark for determining a crystal direction of the hexagonal semiconductor in at least a part of a circumference of the wafer,
    wherein a direction determined by the mark and a <11-20> direction or <1-100> direction of the hexagonal semiconductor form an angle β, which satisfies the following Expression (1):

$-5° \leq \beta \leq 5°$ (1)

wherein the plurality of power semiconductor devices each has an area defined by a rectangle on the principal surface,
    wherein the rectangle is defined by two sides having one side forming an angle γ with the direction determined by the mark, and the angle γ satisfies the following Expression (2) or (2')

$10° \leq \gamma \leq 20°$ (2)

$40° \leq \gamma \leq 50°$ (2').

14. The semiconductor wafer according to claim 13, wherein the mark is an orientation flat.

15. The semiconductor wafer according to claim 13, wherein the mark is a notch.

16. A semiconductor wafer, comprising:
    a wafer made from a hexagonal semiconductor; and
    a plurality of power semiconductor devices formed on the wafer, wherein the wafer has an anisotropic mechanical property due to crystal orientation on a
    plane parallel to a principal surface,
    wherein the wafer is provided with a mark for determining a crystal direction of the hexagonal semiconductor in at least a part of a circumference of the wafer,
    wherein a direction determined by the mark and a <11-20> direction or <1-100> direction of the hexagonal semiconductor form an angle β', which satisfies a relation $10° \leq \beta' 20°$, and wherein the plurality of power semiconductor devices each has an area defined by a rectangle on the principal surface of the wafer.

17. A semiconductor chip manufacturing method, comprising the steps of:
    dividing a semiconductor wafer, which comprises a wafer made from a hexagonal semiconductor and a plurality of power semiconductor devices formed on the wafer, a plurality of times in parallel to a second direction, which is at an angle of 90° with a first direction, while moving the semiconductor wafer relative to a dividing position of a wafer dividing device for a distance c at a time in the first direction, which is at an angle of 15° with a <11-20> direction or <1-100> direction of the hexagonal semiconductor;

rotating strips of the semiconductor wafer, which are obtained by a division, by 90° relative to the wafer dividing device; and dividing the strips of the semiconductor wafer, which are obtained by a division, a plurality of times in parallel to the first direction, while moving the strips of the semiconductor wafer relative to the dividing position of the wafer dividing device for the distance c at a time in the second direction.

* * * * *